(12) United States Patent
Bae et al.

(10) Patent No.: US 11,575,044 B2
(45) Date of Patent: Feb. 7, 2023

(54) INTEGRATED CIRCUIT DEVICE

(71) Applicant: Samsung Electronics Co., Ltd., Suwon-si (KR)

(72) Inventors: Deokhan Bae, Suwon-si (KR); Juhun Park, Seoul (KR); Myungyoon Um, Seoul (KR)

(73) Assignee: Samsung Electronics Co., Ltd.

( * ) Notice: Subject to any disclaimer, the term of this patent is extended or adjusted under 35 U.S.C. 154(b) by 223 days.

(21) Appl. No.: 17/179,982

(22) Filed: Feb. 19, 2021

(65) Prior Publication Data

US 2021/0391464 A1    Dec. 16, 2021

(30) Foreign Application Priority Data

Jun. 10, 2020    (KR) .................. 10-2020-0070357

(51) Int. Cl.
*H01L 29/78* (2006.01)
*H01L 27/088* (2006.01)
*H01L 29/417* (2006.01)
*H01L 21/8238* (2006.01)

(52) U.S. Cl.
CPC ...... *H01L 29/7843* (2013.01); *H01L 27/0886* (2013.01); *H01L 29/41791* (2013.01); *H01L 21/823814* (2013.01)

(58) Field of Classification Search
CPC ..... H01L 21/823418; H01L 21/823814; H01L 21/823431; H01L 21/823871; H01L 21/76834; H01L 21/76883; H01L 21/76897; H01L 29/7843; H01L 29/41766; H01L 29/41791; H01L 29/0673; H01L 29/665; H01L 29/775; H01L 29/42392; H01L 29/66545; H01L 29/78696;
(Continued)

(56) References Cited

U.S. PATENT DOCUMENTS

| 7,737,495 B2 | 6/2010 | Hachimine |
| 7,994,072 B2 | 8/2011 | Hohage et al. |
| 8,237,202 B2 | 8/2012 | Jeong et al. |

(Continued)

FOREIGN PATENT DOCUMENTS

| CN | 105742356 | * | 7/2016 | ..... H01L 21/823821 |
| CN | 106098775 | * | 11/2016 | ....... H01L 29/41791 |

(Continued)

*Primary Examiner* — Mary A Wilczewski
(74) *Attorney, Agent, or Firm* — Myers Bigel, P.A.

(57) ABSTRACT

An integrated circuit device includes a substrate including first and second fin-type active areas, a gate structure on the first and second fin-type active areas, first and second source/drain regions on the first and second fin-type active areas, respectively, a first source/drain contact on the first source/drain region and comprising first and second portions, a second source/drain contact on the second source/drain region and comprising first and second portions, the second portion having an upper surface at a lower level than an upper surface of the first portion, a first stressor layer on the upper surface of the second portion of the first source/drain contact, and a second stressor layer on the upper surface of the second portion of the second source/drain contact, the second stressor layer including a material different from a material included in the first stressor layer.

20 Claims, 35 Drawing Sheets

(58) Field of Classification Search
CPC ............. H01L 27/0886; H01L 27/0924; H01L 23/5283; B82Y 10/00
See application file for complete search history.

(56) References Cited

U.S. PATENT DOCUMENTS

| | | | |
|---|---|---|---|
| 8,384,161 | B2 | 2/2013 | Richter et al. |
| 8,389,316 | B2 | 3/2013 | Wang et al. |
| 10,325,914 | B2 | 6/2019 | Tsai et al. |
| 10,374,040 | B1* | 8/2019 | Chanemougame ........................ H01L 21/823431 |
| 10,553,484 | B2 | 2/2020 | Gwak et al. |
| 10,566,246 | B1* | 2/2020 | Wu .................... H01L 21/76802 |
| 11,195,833 | B2* | 12/2021 | Oh .................... H01L 29/66795 |
| 11,450,572 | B2* | 9/2022 | Chen ................. H01L 21/823814 |
| 2016/0284697 | A1* | 9/2016 | Yoon .................... H01L 27/088 |
| 2016/0284806 | A1* | 9/2016 | Park .................. H01L 29/41783 |
| 2016/0322304 | A1* | 11/2016 | Kim ................... H01L 21/28518 |
| 2017/0148914 | A1* | 5/2017 | Lee ..................... H01L 29/0649 |
| 2018/0090495 | A1* | 3/2018 | Lee ..................... H01L 29/7848 |
| 2018/0130886 | A1* | 5/2018 | Kim ....................... H01L 29/665 |
| 2019/0067131 | A1* | 2/2019 | Liaw ............... H01L 21/823814 |
| 2019/0067444 | A1* | 2/2019 | Ching ............... H01L 21/02057 |
| 2020/0058761 | A1 | 2/2020 | Ho et al. |
| 2020/0119006 | A1* | 4/2020 | Lee ................. H01L 21/823418 |
| 2020/0176309 | A1* | 6/2020 | Chen ................. H01L 21/76805 |
| 2020/0365698 | A1* | 11/2020 | Tsai ................... H01L 21/76849 |
| 2021/0057276 | A1* | 2/2021 | Liu .................... H01L 21/28518 |
| 2021/0104612 | A1* | 4/2021 | Bae ..................... H01L 29/0847 |
| 2021/0327877 | A1* | 10/2021 | Lee ................... H01L 29/66795 |
| 2021/0366786 | A1* | 11/2021 | Chen ................. H01L 21/76805 |
| 2021/0376101 | A1* | 12/2021 | Wang .................... H01L 29/775 |
| 2021/0391464 | A1* | 12/2021 | Bae ..................... H01L 29/7843 |
| 2022/0115375 | A1* | 4/2022 | Xu .................. H01L 21/823821 |
| 2022/0157955 | A1* | 5/2022 | Park ..................... H01L 23/485 |
| 2022/0293600 | A1* | 9/2022 | Kim .................. H01L 27/0924 |

FOREIGN PATENT DOCUMENTS

| | | | | |
|---|---|---|---|---|
| CN | 111952369 | * | 11/2020 | ..... H01L 21/823821 |
| CN | 112017964 | * | 12/2020 | ..... H01L 21/823821 |
| CN | 112420514 | * | 2/2021 | ..... H01L 21/823821 |
| CN | 113363213 | * | 9/2021 | ..... H01L 21/823821 |
| KR | 20190049166 A | | 5/2019 | |
| KR | 10-2022-0144076 | * | 10/2022 | ..... H01L 21/823431 |
| WO | WO 2008/027471 | * | 3/2008 | ..... H01L 21/823814 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2020-0070357, filed on Jun. 10, 2020, in the Korean Intellectual Property Office, the disclosure of which is incorporated by reference herein in its entirety.

FIELD

The inventive concept relates to an integrated circuit device, and more particularly, to an integrated circuit device including a fin-type active area.

BACKGROUND

According to demand for electronic appliances to be light, thin, and small, the demand for high integration of integrated circuit devices has been increasing. Owing to the downscaling of integrated circuit devices, development of integrated circuit devices in which insulating distances among wires and contacts can be reliably provided within a relatively small device area and performance of the integrated circuit devices can be optimized may be demanded.

SUMMARY

The inventive concept provides an integrated circuit device having reduced device area and improved or optimized performance.

According to an aspect of the inventive concept, there is provided an integrated circuit device including a substrate having a first fin-type active area and a second fin-type active area, a gate structure extending in a first direction on the first fin-type active area and the second fin-type active area, the first direction being parallel to an upper surface of the substrate, a first source/drain region on a side of the gate structure on the first fin-type active area, a second source/drain region on a side of the gate structure on the second fin-type active area, a first source/drain contact on the first source/drain region, the first source/drain contact comprising a first portion and a second portion, the second portion of the first source/drain contact having an upper surface that is lower than an upper surface of the first portion of the first source/drain contact relative to the substrate, a second source/drain contact on the second source/drain region, the second source/drain contact comprising a first portion and a second portion, the second portion of the second source/drain contact having an upper surface that is lower than an upper surface of the first portion of the second source/drain contact relative to the substrate, a first stressor layer on the upper surface of the second portion of the first source/drain contact, and a second stressor layer on the upper surface of the second portion of the second source/drain contact, the second stressor layer including a second material different from a first material of the first stressor layer According to another aspect of the inventive concept, there is provided an integrated circuit device including a substrate having a first fin-type active area and a second fin-type active area, the first fin-type active area and the second fin-type active area extending in a first direction, a gate structure extending in a second direction on the first fin-type active area and the second fin-type active area, the second direction being different from the first direction, a first source/drain region on a side of the gate structure on the first fin-type active area, a second source/drain region on a side of the gate structure on the second fin-type active area, a first source/drain contact on the first source/drain region, the first source/drain contact comprising a first portion and a second portion, the second portion of the first source/drain contact having an upper surface that is lower than an upper surface of the first portion of the first source/drain contact relative to the substrate, a second source/drain contact on the second source/drain region, the second source/drain contact comprising a first portion and a second portion, the second portion of the second source/drain contact having an upper surface that is lower than an upper surface of the first portion of the second source/drain contact relative to the substrate, a first stressor layer on the upper surface of the second portion of the first source/drain contact and having an upper surface substantially coplanar with the upper surface of the first portion of the first source/drain contact, and a second stressor layer on the upper surface of the second portion of the second source/drain contact and having an upper surface substantially coplanar with the upper surface of the first portion of the second source/drain contact, the second stressor layer including a second material that is different from a first material of the first stressor layer.

According to another aspect of the inventive concept, there is provided an integrated circuit device including a first fin-type active area and a second fin-type active area protruding from a substrate and extending in a first direction, a plurality of first semiconductor patterns spaced apart from an upper surface of the first fin-type active area, the plurality of first semiconductor patterns each including a respective first channel region, a plurality of second semiconductor patterns spaced apart from an upper surface of the second fin-type active area, the plurality of second semiconductor patterns each including a respective second channel region, a gate structure extending on the first fin-type active area and the second fin-type active area in a second direction that is perpendicular to the first direction, the gate structure extending on the plurality of first semiconductor patterns and the plurality of second semiconductor patterns, a first source/drain region on a side of the gate structure and contacting the plurality of first semiconductor patterns, a second source/drain region on a side of the gate structure and contacting the plurality of second semiconductor patterns, a first source/drain contact on the first source/drain region, the first source/drain contact comprising a first portion and a second portion, the second portion of the first source/drain contact having an upper surface that is lower than an upper surface of the first portion of the first source/drain contact relative to the substrate, a second source/drain contact on the second source/drain region, the second source/drain contact comprising a first portion and a second portion, the second portion of the second source/drain contact having an upper surface that is lower than an upper surface of the first portion of the second source/drain contact relative to the substrate, a first stressor layer on the upper surface of the second portion of the first source/drain contact, and a second stressor layer on the upper surface of the second portion of the second source/drain contact, the second stressor layer including a second material different from a first material of the first stressor layer.

BRIEF DESCRIPTION OF THE DRAWINGS

Embodiments of the inventive concept will be more clearly understood from the following detailed description taken in conjunction with the accompanying drawings in which:

FIGS. 12A to 23B are cross-sectional views illustrating a method of manufacturing an integrated circuit device, according to an embodiment of the inventive concept. In detail, FIGS. 12A, 13A, 14A, 15A, 16A, 17A, 18A, 19A, 20A, 21A, 22A, and 23A show cross-sections taken along lines A1-A1' and A2-A2' of FIG. 1, FIGS. 12B, 13B, 14B, 15B, 16B, 17B, 18B, 19B, 20B, and 21B show cross-sections taken along line B1-B1' of FIG. 1, and FIGS. 22B and 23B show cross-sections taken along line B2-B2' of FIG. 1.

DETAILED DESCRIPTION OF THE EMBODIMENTS

Hereinafter, some embodiments of the inventive concept will be described in detail with reference to accompanying drawings.

Figure 1:
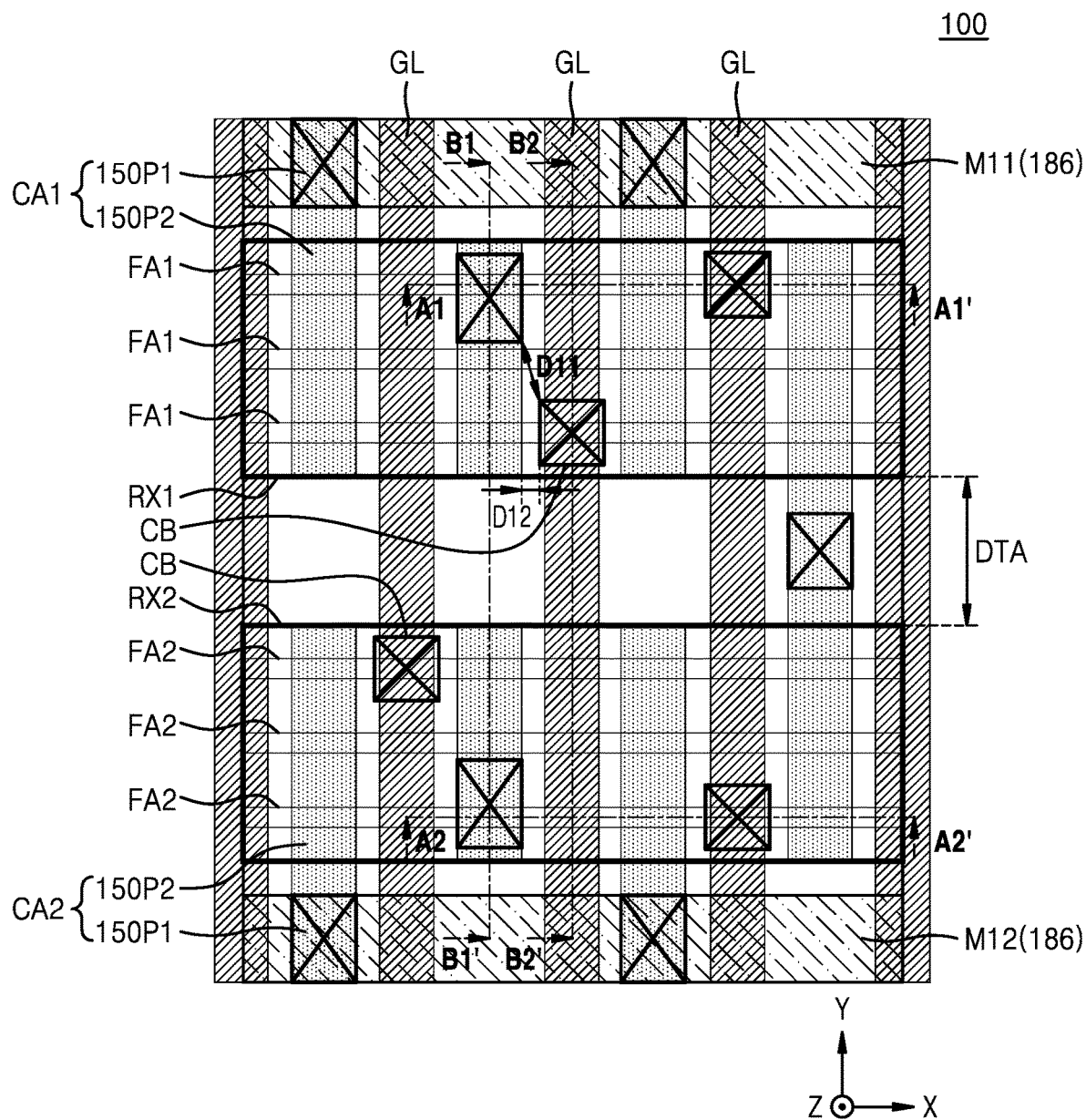
FIG. 1 is a layout of an integrated circuit device according to an embodiment of the inventive concept.
Figure 2:
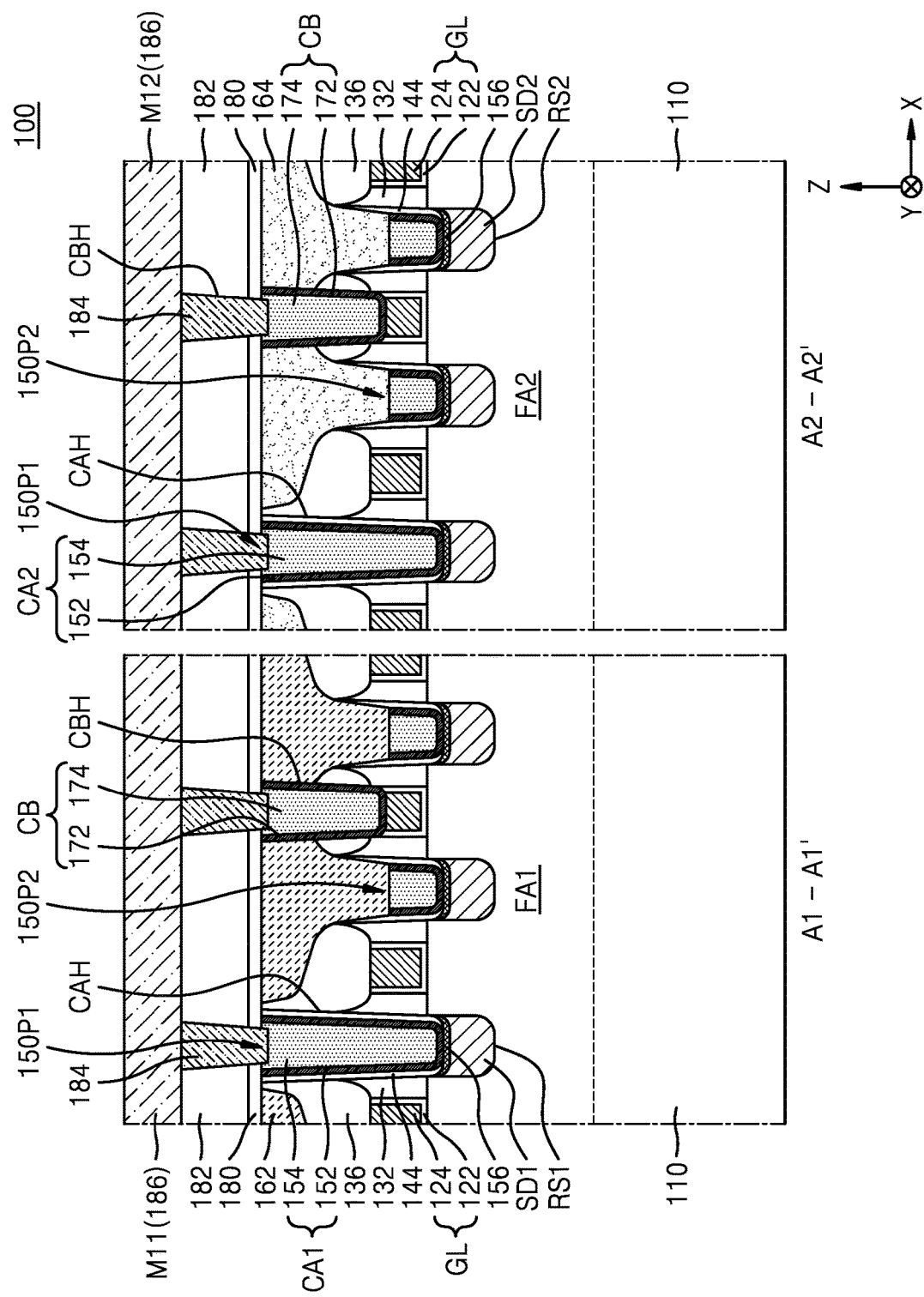
FIG. 2 is a cross-sectional view taken along line A1-A1' and A2-A2' of FIG. 1.
Figure 3:
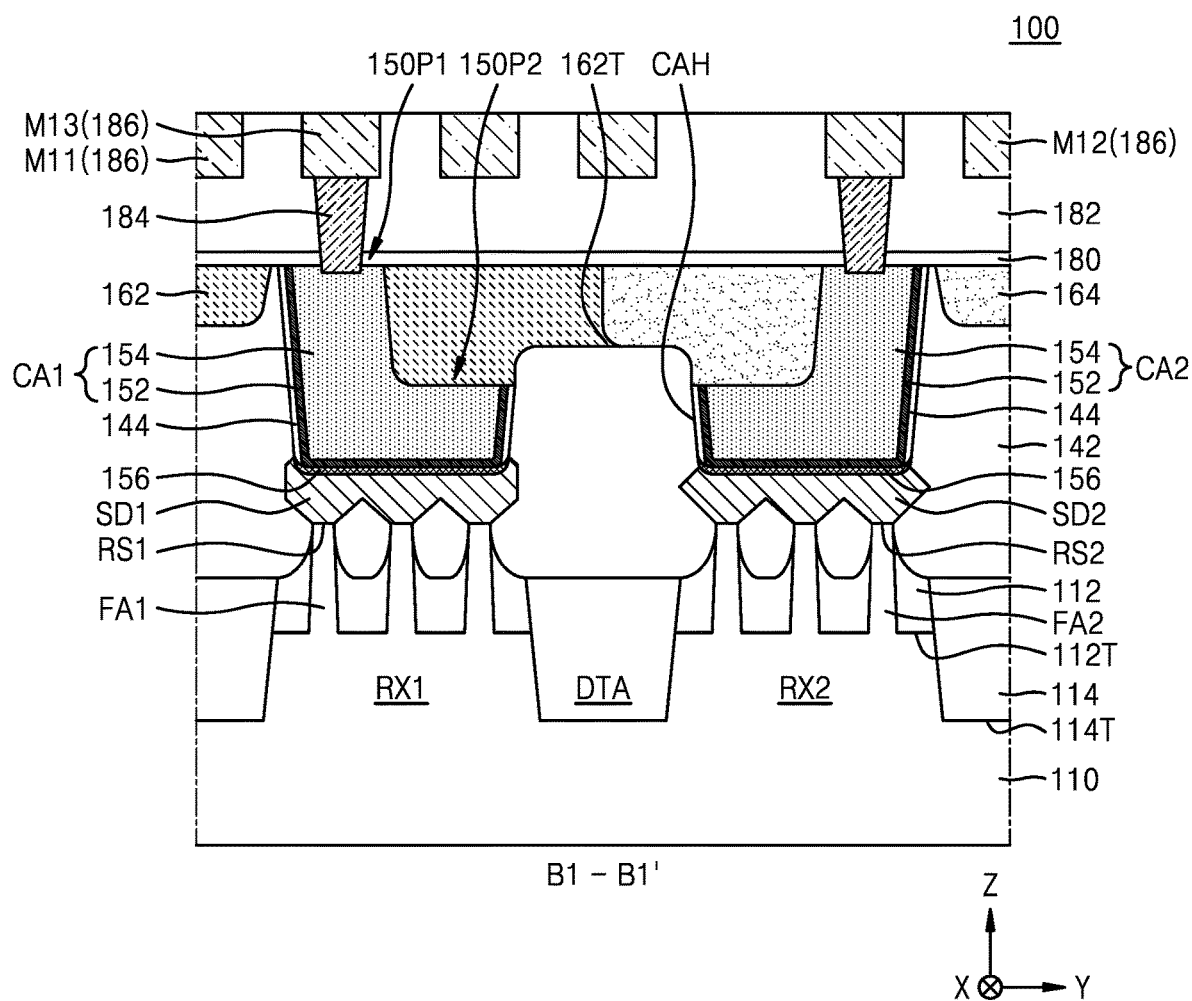
FIG. 3 is a cross-sectional view taken along line B1-B1' of FIG. 1.
Figure 4:
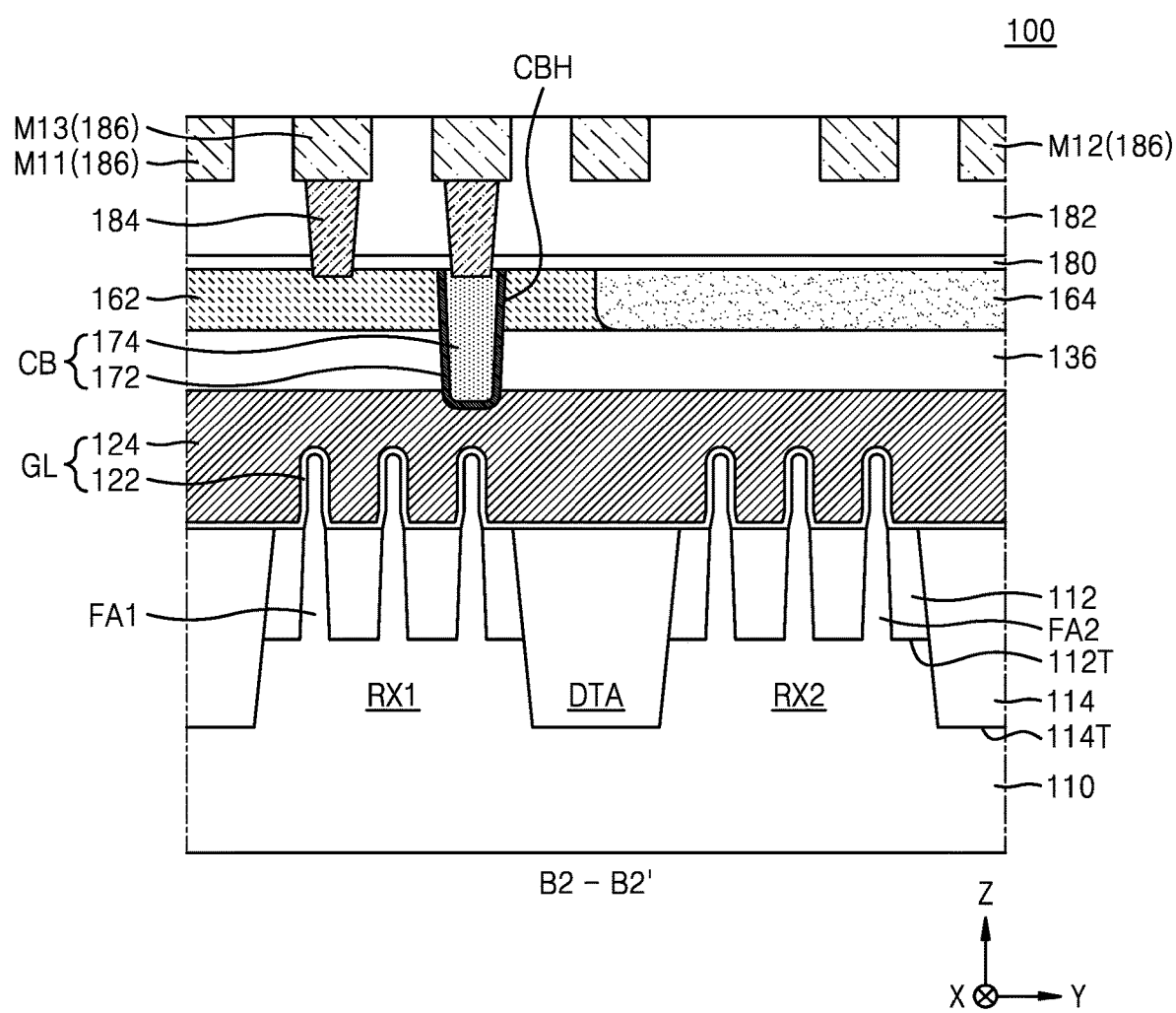
FIG. 4 is a cross-sectional view taken along line B2-B2' of FIG. 1.

FIG. 1 is a layout of an integrated circuit device 100 according to an embodiment of the inventive concept. FIG. 2 is a cross-sectional view taken along lines A1-A1' and A2-A2' of FIG. 1, FIG. 3 is a cross-sectional view taken along line B1-B1' of FIG. 1, and FIG. 4 is a cross-sectional view taken along line B2-B2' of FIG. 1. In FIG. 1, some of the elements in the integrated circuit device 100 are omitted for convenience of description.

Referring to FIG. 1 to FIG. 4, a substrate 110 may include a first active area RX1, a second active area RX2, and a deep trench area DTA. The first active area RX1 and the second active area RX2 may be spaced apart from each other with the deep trench area DTA therebetween. The terms "first," "second," "third," etc. may be used herein merely to distinguish one element, layer, area, etc., from another. The term "and/or" includes any and all combinations of the listed elements. The term "levels" as used herein may indicate distances above or relative to the substrate 110 unless otherwise noted. The term "directly on" or "directly contacting" indicates the absence of intervening elements between elements, layers, areas, etc.

In some embodiments, the first active area RX1 may be an active area for an NMOS transistor, and the second active area RX2 may be an active area for a PMOS transistor. In another embodiments, the first active area RX1 may be an active area for an NMOS transistor having a first threshold voltage, and the second active area RX2 may be an active area for an NMOS transistor having a second threshold voltage, the second threshold voltage being different from the first threshold voltage.

In some embodiments, the first active area RX1, the second active area RX2, and the deep trench area DTA may constitute a standard cell that is configured to execute logical functions. The standard cell may include various kinds of logic cells including a plurality of circuit devices such as a transistor and a register. The logic cell may configure or otherwise include, for example, an AND, a NAND, an OR, a NOR, an exclusive OR (XOR), an exclusive NOR (XNOR), an inverter (INV), an adder (ADD), a buffer (BUF), a delay (ELY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, a latch, etc.

In the first active area RX1, a plurality of first fin-type active areas FA1 may protrude from an upper surface of the substrate 110, and the plurality of first fin-type active areas FA1 may extend in a first direction (X-direction). In the second active area RX2, a plurality of second fin-type active areas FA2 may protrude from the upper surface of the substrate 110, and the plurality of second fin-type active areas FA2 may extend in the first direction (X-direction). Opposite or opposing side walls of the plurality of first fin-type active areas FA1 and opposite or opposing side walls of the plurality of second fin-type active areas FA2 may be covered by an isolation layer 112. In the deep trench area DTA, a deep trench 114T may be formed to a predetermined depth from the upper surface of the substrate 110, and a deep trench insulation layer 114 may be filled in the deep trench 114T.

In some embodiments, the substrate 110 may include a Group-IV semiconductor such as Si or Ge, a Group IV-IV compound semiconductor such as SiGe or SiC, or a Group III-V compound semiconductor such as GaAs, InAs, or InP. The substrate 110 may include a conductive region, for example, a well doped with impurities or a structure doped with impurities.

A gate structure GL may extend in a second direction (Y-direction) to intersect with the plurality of first fin-type active areas FA1 and the plurality of second fin-type active areas FA2. The gate structure GL may include a gate insulating layer 122 and a gate electrode 124. A gate spacer 132 may be on a side wall of the gate structure GL, and a gate capping layer 136 may be on the gate structure GL and the gate spacer 132.

The gate electrode 124 may include doped polysilicon, a metal, a conductive metal nitride, a conductive metal carbide, a conductive metal silicide, or combinations thereof. For example, the gate electrode 124 may include, but is not limited to, Al, Cu, Ti, Ta, W, Mo, TaN, NiSi, CoSi, TiN, WN, TiAl, TiAlN, TaCN, TaC, TaSiN, or combinations thereof. In some embodiments, the gate electrode 124 may include a work function metal containing layer and a gap-fill metal layer. The work function metal containing layer may include Ti, W, Ru, Nb, Mo, Hf, Ni, Co, Pt, Yb, Tb, Dy, Er, and/or Pd. The gap-fill metal layer may include a W layer and/or an Al layer. In some embodiments, the gate electrode 124 may include a stack structure including TiAlC/TiN/W, a stack structure including TiN/TaN/TiAlC/TiN/W, or a stack structure including TiN/TaN/TiN/TiAlC/TiN/W, but is not limited thereto.

The gate insulating layer 122 may extend on a bottom surface and a side wall of the gate insulating layer 124 in the second direction. The gate insulating layer 122 may be between the gate electrode 124 and the fin-type active area FA1 and FA2, and between the gate electrode 124 and an upper surface of the isolation layer 112. The gate insulating layer 122 may include a silicon oxide layer, a silicon oxynitride layer, a high-k dielectric layer having a dielectric constant greater than that of the silicon oxide layer, or combinations thereof. The high-k dielectric layer may include metal oxide or metal oxynitride. For example, the high-k dielectric layer that may be used as the gate insulating layer 122 may include $HfO_2$, HfSiO, HfSiON, HfTaO, HfSiO, HfZrO, $ZrO_2$, $Al_2O_3$, or combinations thereof, but is not limited thereto.

The gate spacers 132 cover opposite side walls of the gate structure GL and may extend in the second direction (Y-direction of FIG. 2). The gate spacer 132 may include silicon oxide ($SiO_x$), silicon nitride ($SiN_x$), silicon oxynitride ($SiO_xN_y$), silicon carbonitride ($SiC_xN_y$), silicon oxycarbide nitride ($SiO_xC_yN_z$), or combinations thereof.

In some embodiments, the gate spacer 132 may include a plurality of layers including different materials from one another. FIG. 2 shows an example, in which the gate spacer 132 includes a single layer, but in some embodiments the gate spacer 132 may include a first spacer layer, a second spacer layer, and a third spacer layer that are sequentially stacked on the side wall of the gate electrode 124. In some embodiments, the first spacer layer and the third spacer layer may each include silicon nitride, silicon oxide, or silicon oxynitride. The second spacer layer may include an insulating material having a dielectric constant lower than that of the first spacer layer. In some embodiments, the second spacer layer may include an air gap or air space, i.e., a portion thereof that is open or otherwise defines an air cavity.

The gate capping layer 136 may cover the upper surfaces of the gate structure GL and the gate spacer 132 and may extend in the second direction (Y-direction of FIG. 2). In some embodiments, the gate capping layer 136 may include silicon nitride or silicon oxynitride. As shown in FIG. 2, the gate capping layer 136 may at least partially include an uneven upper surface. For example, at least a part of the gate capping layer 136 may have a convex upper surface protruding upward relative to the substrate 110, and a level of the upper surface of the gate capping layer 136 on the gate electrode 124 may be higher (relative to the substrate 110) than a level of the upper surface of the gate capping layer 136 on the gate spacer 132.

In the first active area RX1, first recess regions RS1 may extend into the first fin-type active areas FA1 at opposite sides of the gate structure GL, and a first source/drain region SD1 may be formed in each of the first recess regions RS1. In the second active area RX2, second recess regions RS2 may extend into the second fin-type active areas FA2 at opposite sides of the gate structure GL, and a second source/drain region SD2 may be formed in each of the second recess regions RS2.

The first source/drain region SD1 is formed in the first recess region RS1 and may have a plurality of inclined side walls. The first source/drain region SD1 may include a doped SiGe layer, a doped Ge layer, a doped SiC layer, or a doped InGaAs layer, but is not limited thereto. The first fin-type active areas FA1 at the opposite sides of the gate structure GL are partially removed to form the first recess regions RS1, and then a semiconductor layer filling each of the first recess regions RS1 is grown through an epitaxy process to form the first source/drain region SD1.

In some embodiments, when the first fin-type active area FA1 is an active area for an NMOS transistor, the first source/drain region SD1 may include doped SiC, and when the first fin-type active area FA1 is an active area for a PMOS transistor, the first source/drain region SD1 may include doped SiGe. However, some embodiments are not limited thereto.

In some embodiments, the first source/drain region SD1 may include a plurality of semiconductor layers having different compositions from one another. For example, the first source/drain region SD1 may include a lower semiconductor layer, an upper semiconductor layer, and a capping semiconductor layer that are sequentially filled in the first recess region RS1. For example, the lower semiconductor layer, the upper semiconductor layer, and the capping semiconductor layer may each include SiC, while the content or relative concentrations of Si and C may vary among the upper, lower, and capping semiconductor layers.

The second source/drain region SD2 may be formed in the second recess region RS2 and may include a plurality of inclined side walls. The second source/drain region SD2 may include a doped SiGe layer, a doped Ge layer, a doped SiC layer, or a doped InGaAs layer, but is not limited thereto. The second fin-type active areas FA2 at the opposite sides of the gate structure GL are partially removed to form the second recess regions RS2, and then a semiconductor layer filling each of the second recess regions RS2 is grown through an epitaxy process to form the second source/drain region SD2.

In some embodiments, the second source/drain region SD2 may include a plurality of semiconductor layers having different compositions from one another. For example, the second source/drain region SD2 may include a lower semiconductor layer, an upper semiconductor layer, and a capping semiconductor layer that are sequentially filled in the second recess region RS2. For example, the lower semiconductor layer, the upper semiconductor layer, and the capping semiconductor layer may each include SiC, while the content or relative concentrations of Si and C may vary among the upper, lower, and capping semiconductor layers.

Although not shown in the drawings, an etch stop layer may be further formed on the side walls of the first source/drain region SD1, the side walls of the second source/drain region SD2, and an upper surface of the isolation layer 112. The etch stop layer may include silicon nitride, silicon oxynitride, silicon oxycarbide nitride, and/or silicon oxide.

An inter-gate insulating layer 142 may be formed to cover the first and second source/drain regions SD1 and SD2 between the gate structure GL. The inter-gate insulating layer 142 may include silicon oxide or silicon oxynitride.

A first source/drain contact CA1 may be disposed on the first source/drain region SD1 in a source/drain contact hole CAH that penetrates through the inter-gate insulating layer 142, and a second source/drain contact CA2 may be disposed on the second source/drain region SD2 in the source/drain contact hole CAH penetrating through the inter-gate insulating layer 142.

A contact liner 144 surrounding side walls of the first source/drain contact CA1 and side walls of a second source/drain contact CA2 may be further provided in the source/drain contact hole CAH. The contact liner 144 may include a metal material including Ti, W, Ru, Nb, Mo, Hf, Ni, Co, Pt, Yb, Tb, Dy, Er, and/or Pd. In some embodiments, an insulating liner including silicon nitride may be further formed between the contact liner 144 and the gate spacer 132 or between the contact liner 144 and the inter-gate insulating layer 142.

The first source/drain contact CA1 and the second source/drain contact CA2 may each include a conductive barrier layer 152 disposed on an internal wall of the source/drain contact hole CAH, and a contact plug 154 surrounded by the conductive barrier layer 152 and filling in the source/drain contact hole CAH. The conductive barrier layer 152 may include ruthenium (Ru), titanium (Ti), titanium nitride (TiN), tantalum (Ta), tantalum nitride (TaN), tungsten (W), titanium silicon nitride (TiSiN), titanium silicide (TiSi), and/or tungsten silicide (WSi). The contact plug 154 may include tungsten (W), cobalt (Co), nickel (Ni), ruthenium (Ru), copper (Cu), aluminum (Al), silicides thereof, and/or alloys thereof. A metal silicide layer 156 may be further disposed between the first source/drain contact CA1 and the first source/drain region SD1 and between the second source/drain contact CA2 and the second source/drain region SD2.

The first source/drain contact CA1 may include a first portion 150P1 and a second portion 150P2, and an upper surface of the second portion 150P2 may be at a lower level (relative to the substrate 110) than an upper surface of the first portion 150P1. As shown in FIG. 3, the first portion 150P1 and the second portion 150P2 may each have a substantially planar or flat upper surface and may be integrally connected to each other.

As shown in FIG. 2, the first portion 150P1 of one first source/drain contact CA1 is on one side of one gate structure GL, and the second portion 150P2 of another first source/drain contact CA1 may be on the other side of one gate structure GL. The second portion 150P2 may have an upper surface that is at a lower level than that of the upper surface of the adjacent gate structure GL (that is, the upper surface of the gate electrode 124).

In some embodiments, the first source/drain contact CA1 may be formed by filling a metal layer in the source/drain contact hole CAH and performing a recess process on a part of the metal layer to reduce a height of the part. The part of the metal layer, which has a reduced height due to the recess process, may correspond to the second portion 150P2, and a remaining part of the metal layer may correspond to the first portion 150P1. Also, the gate capping layer 136, which is adjacent to the first portion 150P1 of the first source/drain contact CAL may be relatively less exposed to an etching atmosphere during the recess process, and accordingly, the gate capping layer 136 adjacent to the first portion 150P1 of the first source/drain contact CA1 may have an upper surface that is at substantially the same level as (i.e., is substantially coplanar with) the upper surface of the first portion 150P1.

The second source/drain contact CA2 may also include a first portion 150P1 and a second portion 150P2, and an upper surface of the second portion 150P2 may be at a lower level (relative to the substrate 110) than an upper surface of the first portion 150P1. The first portion 150P1 and the second portion 150P2 may each have a substantially planar or flat upper surface and may be integrally connected to each other.

A first stressor layer 162 may be disposed on the upper surface of the second portion 150P2 of the first source/drain contact CA1 and the convex upper surface of the gate capping layer 136, wherein the convex upper surface of the gate capping layer 136 is adjacent to the upper surface of the second portion 150P2 in the first active area RX1. The first stressor layer 162 surrounds the side wall of the first portion 150P1 of the first source/drain contact CAL and may extend to the level identical to the upper surface of the second portion 150P2 of the first source/drain contact CAL that is, to the level lower than that of the upper surface of the gate electrode 124.

In some embodiments, the first stressor layer 162 may include a first insulating material, and the first insulating material may include SiOC, SiON, SiCN, SiN, Tonen SilaZene (TOSZ), tetraethyl orthosilicate (TEOS), atomic layer deposition (ALD) oxide, flowable chemical vapor deposition (FCVD) oxide, high density plasma (HDP) oxide, and/or plasma enhanced oxidation (PEOX) oxide. For example, when the first active area RX1 is an NMOS transistor forming area, the first stressor layer 162 may apply tensile stress to the NMOS transistor to improve the electrical performance of the NMOS transistor.

A second stressor layer 164 may be disposed on the upper surface of the second portion 150P2 of the second source/drain contact CA2 and the convex upper surface of the gate capping layer 136, wherein the convex upper surface of the gate capping layer 136 is adjacent to the upper surface of the second portion 150P2 of the second active area RX2. The second stressor layer 164 surrounds the side walls of the first portion 150P1 of the second source/drain contact CA2, and may extend to the level identical to the upper surface of the second portion 150P2 of the second source/drain contact CA2, that is, to the level lower than that of the upper surface of the gate electrode 124.

In some embodiments, the second stressor layer 164 may include a second insulating material that is different from the first insulating material, and the second insulating material may include SiOC, SiON, SiCN, SiN, TOSZ, TEOS, ALD oxide, FCVD oxide, HDP oxide, and/or PEOX oxide. For example, when the second active area RX2 is a PMOS transistor forming area, the second stressor layer 164 may apply compressive stress to the PMOS transistor to improve the electrical performance of the PMOS transistor.

In some embodiments, when the first active area RX1 is an NMOS transistor forming area and the second active area RX2 is a PMOS transistor forming area, the second stressor layer 164 may include a material that may apply the compressive stress to a material thereunder, as compared with the first stressor layer 162. Also, as compared with the second stressor layer 164, the first stressor layer 162 may include a material that may apply the tensile stress to a material disposed thereunder. In some embodiments, the first stressor layer 162 may include SiOC and the second stressor layer 164 may include SiCN. In another embodiment, the first stressor layer 162 may include an FCVD oxide and the second stressor layer 164 may include SiCN. However, the materials included in the first stressor layer 162 and the second stressor layer 164 are not limited to the above examples.

In the example shown in FIG. 3, the first portion 150P1 of the first source/drain contact CA1, the first portion 150P1 of the second source/drain contact CA2, the first stressor layer 162, and the second stressor layer 164 may have upper surfaces that are substantially coplanar or at the same level. Also, the side wall of the first stressor layer 162 may be in contact with the side wall of the second stressor layer 164 on the inter-gate insulating layer 142 that is disposed on the deep trench area DTA. A tail portion 162T may be formed on the side wall of the first stressor layer 162 that is in contact with the inter-gate insulating layer 142, but a shape and a size of the tail portion 162T are not limited to the example of FIG. 3.

In another embodiments, in contrast with the example of FIG. 3, a bottom surface of the first stressor layer 162 disposed on the inter-gate insulating layer 142 may be at a higher level than a bottom surface of the second stressor layer 164 disposed on the inter-gate insulating layer 142. In this case, the side wall of the first stressor layer 162 that is in contact with the inter-gate insulating layer 142 may have a vertical profile, and the tail portion 162T may not be formed.

A gate contact CB may be disposed to be connected to the gate electrode 124, on at least one of the first active area RX1 and the second active area RX2. For example, the gate contact CB that is disposed to vertically overlap the first active area RX1 may be provided in the gate contact hole CBH penetrating through the first stressor layer 162 and the gate capping layer 136, and a bottom portion of the gate contact CB may be connected to the gate electrode 124. The gate contact CB disposed to vertically overlap the second active area RX2 may be disposed in the gate contact hole CBH penetrating through the second stressor layer 164 and the gate capping layer 136.

The gate contact CB may include a conductive barrier layer 172 disposed on an internal wall of the gate contact hole CBH, and a contact plug 174 surrounded by the conductive barrier layer 172 and filled in the gate contact hole CBH. The conductive barrier layer 172 may include ruthenium (Ru), titanium (Ti), titanium nitride (TiN), tantalum (Ta), tantalum nitride (TaN), tungsten (W), titanium silicon nitride (TiSiN), titanium silicide (TiSi), and/or tungsten silicide (WSi). The contact plug 174 may include tungsten (W), cobalt (Co), nickel (Ni), ruthenium (Ru), copper (Cu), aluminum (Al), silicides thereof, and/or alloys thereof.

As shown in FIG. 1, the gate contact CB is disposed on the first active area RX1, and may have a relatively large separation distance D11 from the first portion 150P1 of the first source/drain contact CA1 and a relatively small separation distance D12 from the second portion 150P2 of the first source/drain contact CA1. Because the second portion 150P2 of the first source/drain contact CA1 has the upper surface that is at a lower level than that of the adjacent gate structure GL (that is, the upper surface of the gate electrode 124), an undesired electric connection between the gate contact CB and the second portion 150P2 may be reduced or prevented during the process of forming the gate contact CB.

In FIG. 1, the gate contact CB is disposed on the first active area RX1 and the second active area RX2, but an additional gate contact CB may be on the deep trench area DTA.

The etch stop layer 180 and the interlayer insulating layer 182 may be disposed on the first source/drain contact CAL the second source/drain contact CA2, the first stressor layer 162, the second stressor layer 164, and the gate contact CB. The etch stop layer 180 may include SiC, SiN, nitrogen-doped silicon carbide (SiC:N), SiOC, AlN, AlON, AlO, AlOC, or combinations thereof. The interlayer insulating layer 182 may include an oxide layer, a nitride layer, an ultra low-k (ULK) layer having an ultra-low dielectric constant k of about 2.2 to about 2.4, or combinations thereof.

A conductive via 184 may penetrate through the interlayer insulating layer 182 and the etch stop layer 180 to be connected to the first portion 150P1 of the first source/drain contact CAL the first portion 150P1 of the second source/drain contact CA2, and the gate contact CB.

A wiring layer 186 may be on the conductive via 184. For example, the wiring layer 186 may include a first wiring line M11 configured to apply a power voltage VDD to the first source/drain region SD1 via or through the first source/drain contact CAL a second wiring line M12 configured to apply a ground voltage VSS to the second source/drain region SD2 via or through the second source/drain contact CA2, and a plurality of third wiring lines M13 disposed in parallel with the first wiring line M11 and the second wiring line M12 and connected to at least one of the first source/drain contact CAL the second source/drain contact CA2, and the gate contact CB.

In general, according to the downscaling of integrated circuit devices, a width of the gate structure GL and a gap between the gate structures GL are reduced, and accordingly, a height of a standard cell (that is, a length of the standard cell in the Y-direction) may be reduced. However, the gate contact CB may be disposed in the deep trench area DTA in order to ensure a sufficient separation distance between the first source/drain contact CA1 and the gate contact CB, and thus, there may be limitations in reducing an area or a height of the integrated circuit device.

However, according to the embodiments described above, because the recess process is performed on the first source/drain contact CAL the first source/drain contact CA1 is formed to have the second portion 150P2 at a lower level than the upper surface of the gate electrode 124 and the first portion 150P1 at a higher level than the second portion 150P2. Accordingly, even when the gate contact CB is disposed on the first active area RX1, a sufficient separation distance may be ensured between the gate contact CB and the first portion 150P1 of the first source/drain contact CA1. Additionally or alternatively, even when the gate contact CB is disposed on the second active area RX2, a sufficient separation distance may be ensured between the gate contact CB and the first portion 150P1 of the second source/drain contact CA2. Therefore, an area of the deep trench area DTA may be reduced and the height of the integrated circuit device 100 may be reduced.

Moreover, the first stressor layer 162 covering the upper surface of the second portion 150P2 of the first source/drain contact CA1 and the second stressor layer 164 covering the upper surface of the second portion 150P2 of the second source/drain contact CA2 apply tensile stress and compressive stress to the NMOS transistor and the PMOS transistor, respectively, and thus, the electrical performance of the integrated circuit device 100 may be improved or optimized.

Figure 5:
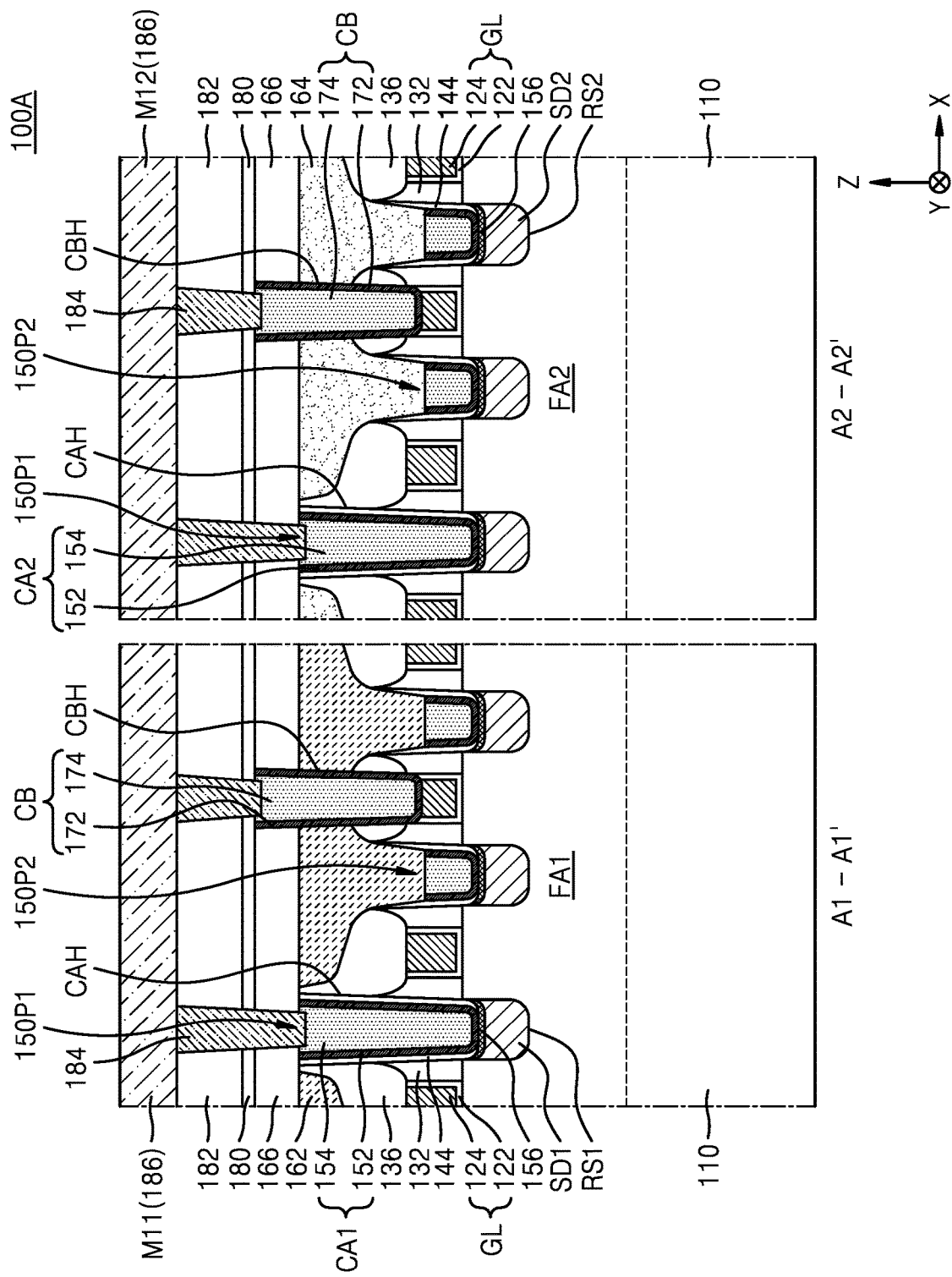
FIG. 5 is a cross-sectional view of an integrated circuit device according to an embodiment of the inventive concept.

FIG. 5 is a cross-sectional view of an integrated circuit device 100A according to an embodiment of the inventive concept. FIG. 5 is a cross-sectional view taken along lines A1-A1' and A2-A2' of FIG. 1. In FIG. 5, the same reference numerals as those of FIGS. 1 to 4 denote the same elements.

Referring to FIG. 5, an interlayer insulating layer 166 is disposed on the first stressor layer 162, the second stressor layer 164, and the first and second source/drain contacts CA1 and CA2, and the etch stop layer 180 may be disposed on the interlayer insulating layer 166. The gate contact hole CBH penetrates through the interlayer insulating layer 166, the first stressor layer 162, and the gate capping layer 136, and the upper surface of the gate contact CB may be at a higher level (relative to the substrate 110) than the upper surfaces of the first and second source/drain contacts CA1 and CA2.

Figure 6:
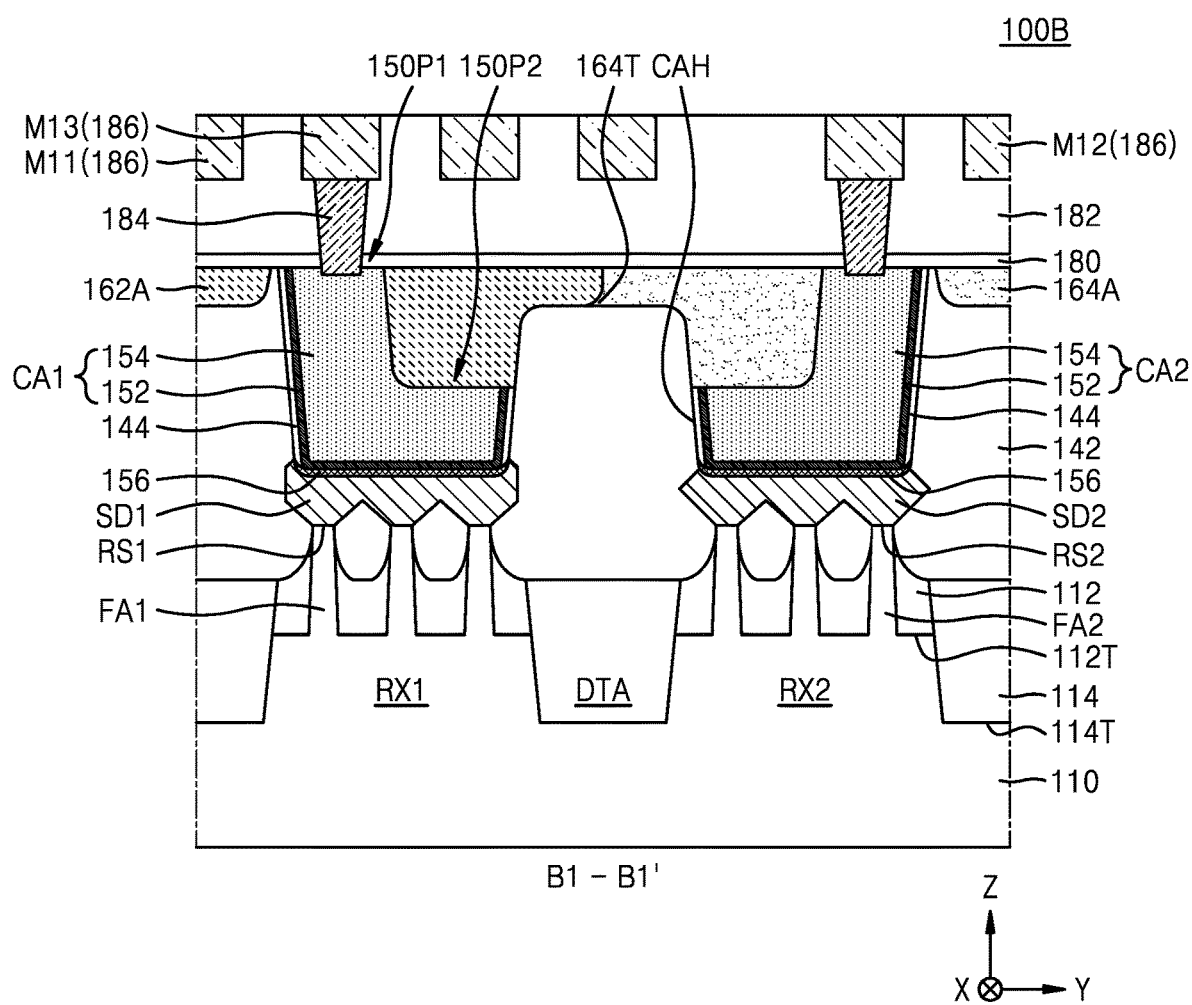
FIG. 6 is a cross-sectional view of an integrated circuit device according to an embodiment of the inventive concept.

FIG. 6 is a cross-sectional view of an integrated circuit device 100B according to an embodiment of the inventive concept. FIG. 6 is a cross-sectional view taken along line B1-B1' of FIG. 1. In FIG. 6, the same reference numerals as those of FIGS. 1 to 5 denote the same elements.

Referring to FIG. 6, a side wall of a first stressor layer 162A may be in contact with a side wall of a second stressor layer 164A on the inter-gate insulating layer 142 that is disposed on the deep trench area DTA. Heights (or thicknesses in the vertical or Z-direction) of the first stressor layer 162A and the second stressor layer 164A disposed on the deep trench area DTA may be less than those of the first stressor layer 162 and the second stressor layer 164 described above with reference to FIG. 3.

Figure 17A:
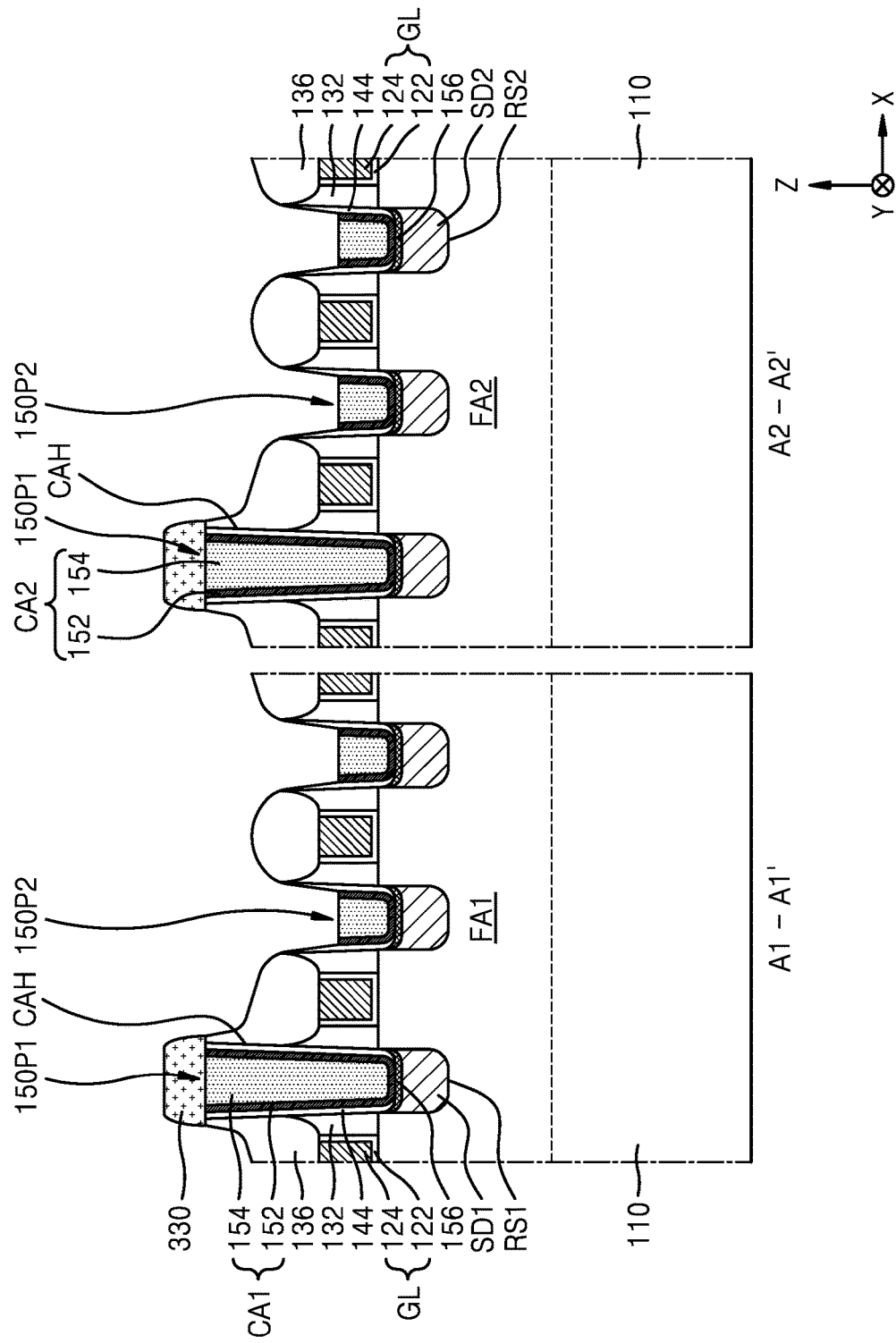
Figure 17B:
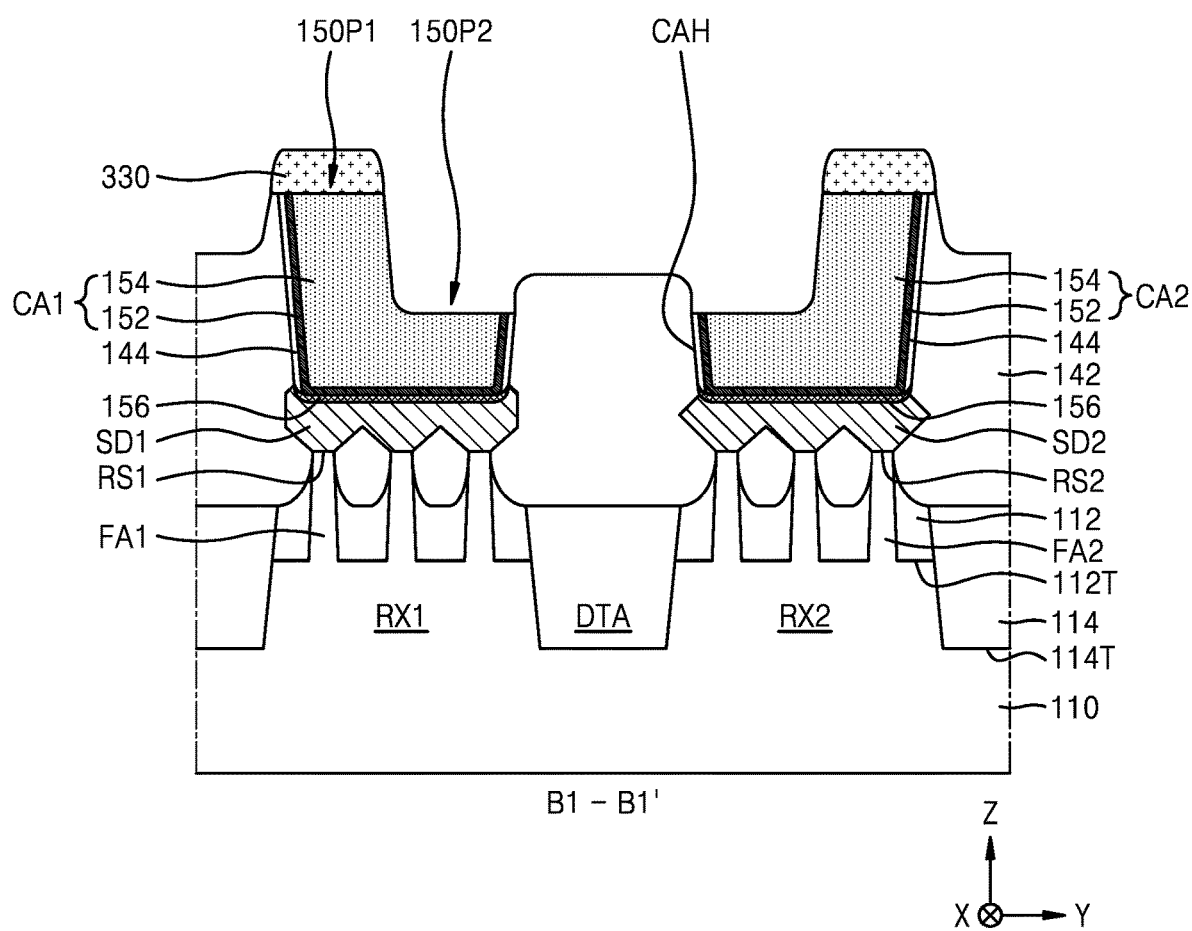

In the example manufacturing processes, the recess process for etching the first source/drain contact CA1 and the second source/drain contact CA2 is performed to reduce the heights of the first source/drain contact CA1 and the second source/drain contact CA2 that are not covered by a mask pattern 330 (see FIGS. 17A and 17B). In the recess process, an etching amount of the inter-gate insulating layer 142 may be relatively small, and in this case, the heights or thicknesses of the first and second stressor layers 162A and 164A formed on the inter-gate insulating layer 142 may be relatively small.

A tail portion 164T may be formed on the side wall of the second stressor layer 164A that is in contact with the inter-gate insulating layer 142, but a shape and a size of the tail portion 164T are not limited to the example of FIG. 6. In the example manufacturing processes, the second stressor layer 164A is formed on the first active area RX1, the second active area RX2, and the deep trench area DTA, and then, a mask pattern 340 (e.g., similar to FIG. 19B) partially covering the second active area RX2 and the deep trench area DTA is formed and a part of the second stressor layer 164A covering the first active area RX1 may be removed by using the mask pattern 340 as an etching mask. In the process of partially removing the second stressor layer 164A, the second stressor layer 164A partially remains on the inter-gate insulating layer 142 on the deep trench area DTA to form the tail portion 164T.

In another embodiment, a bottom surface of the second stressor layer 164A disposed on the inter-gate insulating layer 142 may be at a higher level than a bottom surface of the first stressor layer 162A disposed on the inter-gate insulating layer 142. In this case, the side wall of the second stressor layer 164A that is in contact with the inter-gate insulating layer 142 may have a vertical profile, and the tail portion 164T may not be formed.

Figure 7:
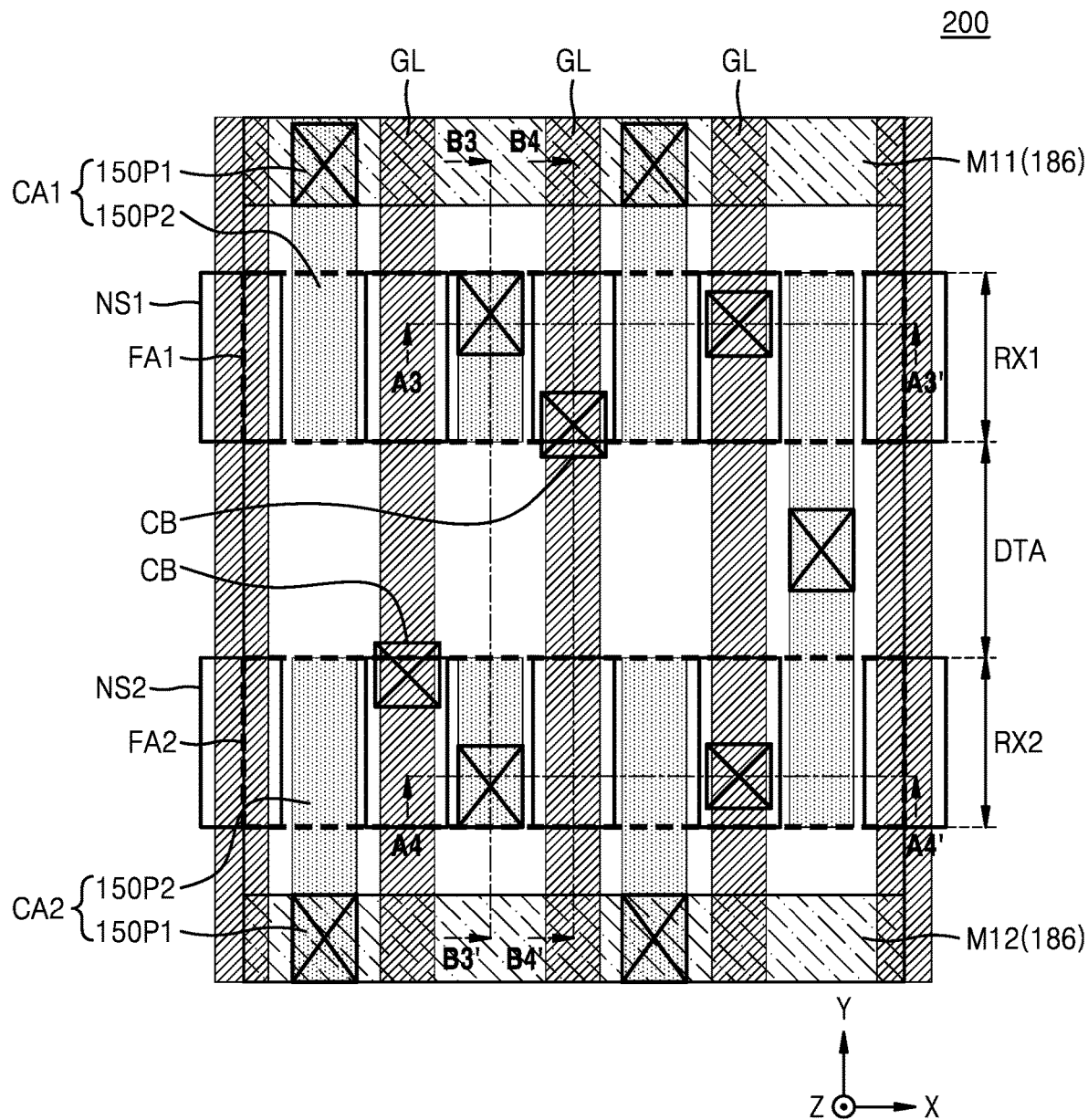
FIG. 7 is a layout of an integrated circuit device according to an embodiment of the inventive concept.
Figure 8:
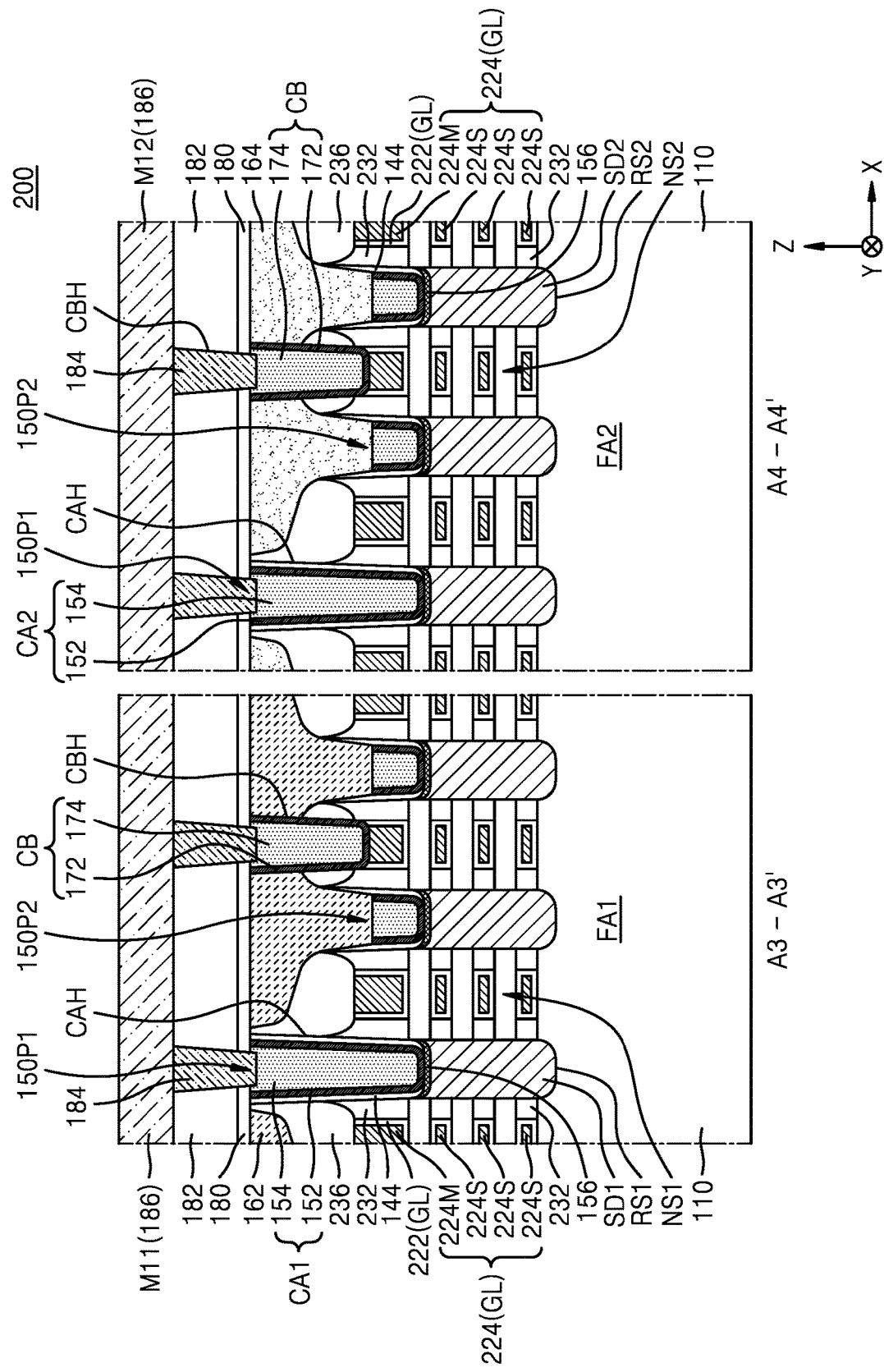
FIG. 8 is a cross-sectional view taken along line A3-A3' and A4-A4' of FIG. 7.
Figure 9:
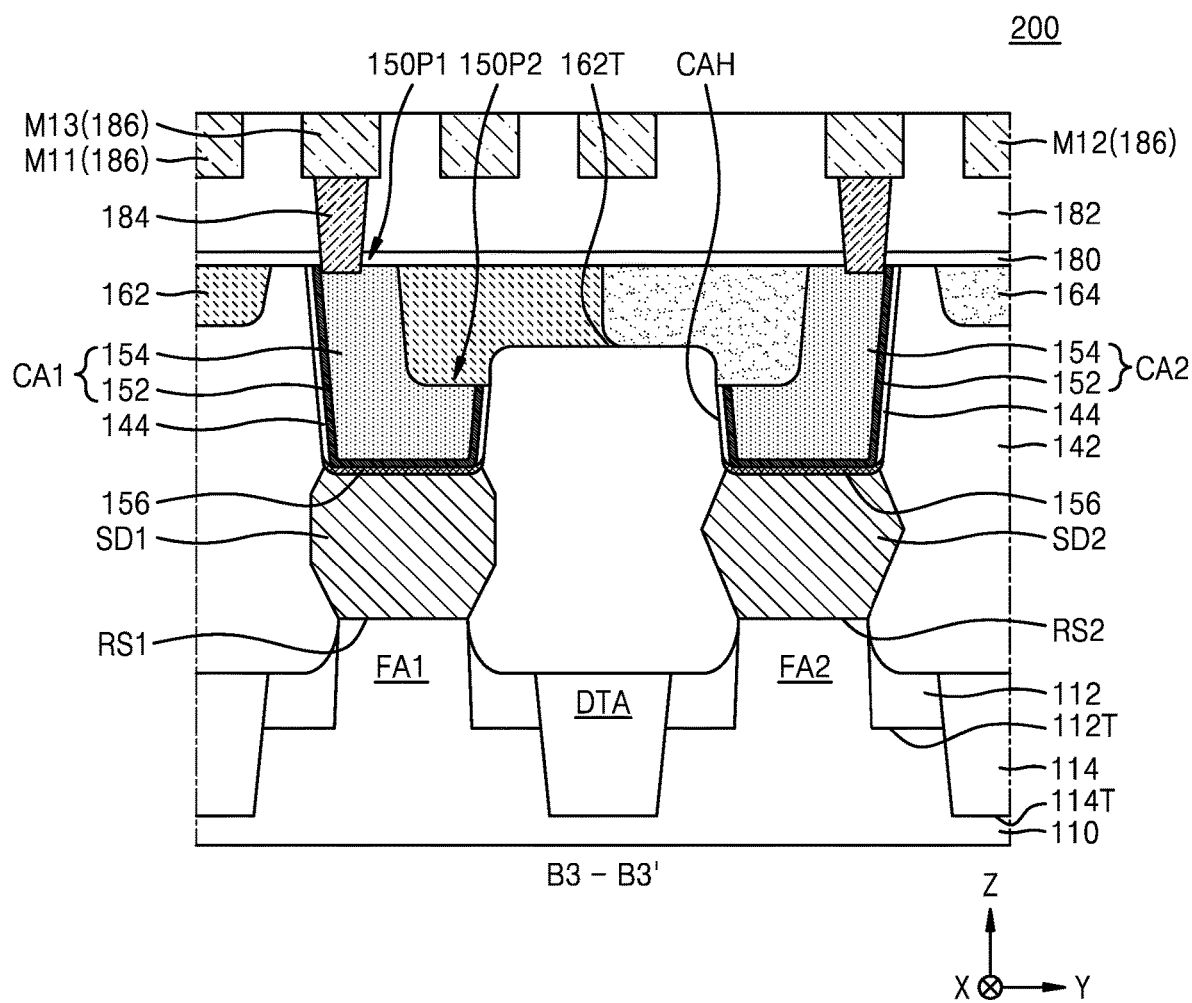
FIG. 9 is a cross-sectional view taken along line B3-B3' of FIG. 7.
Figure 10:
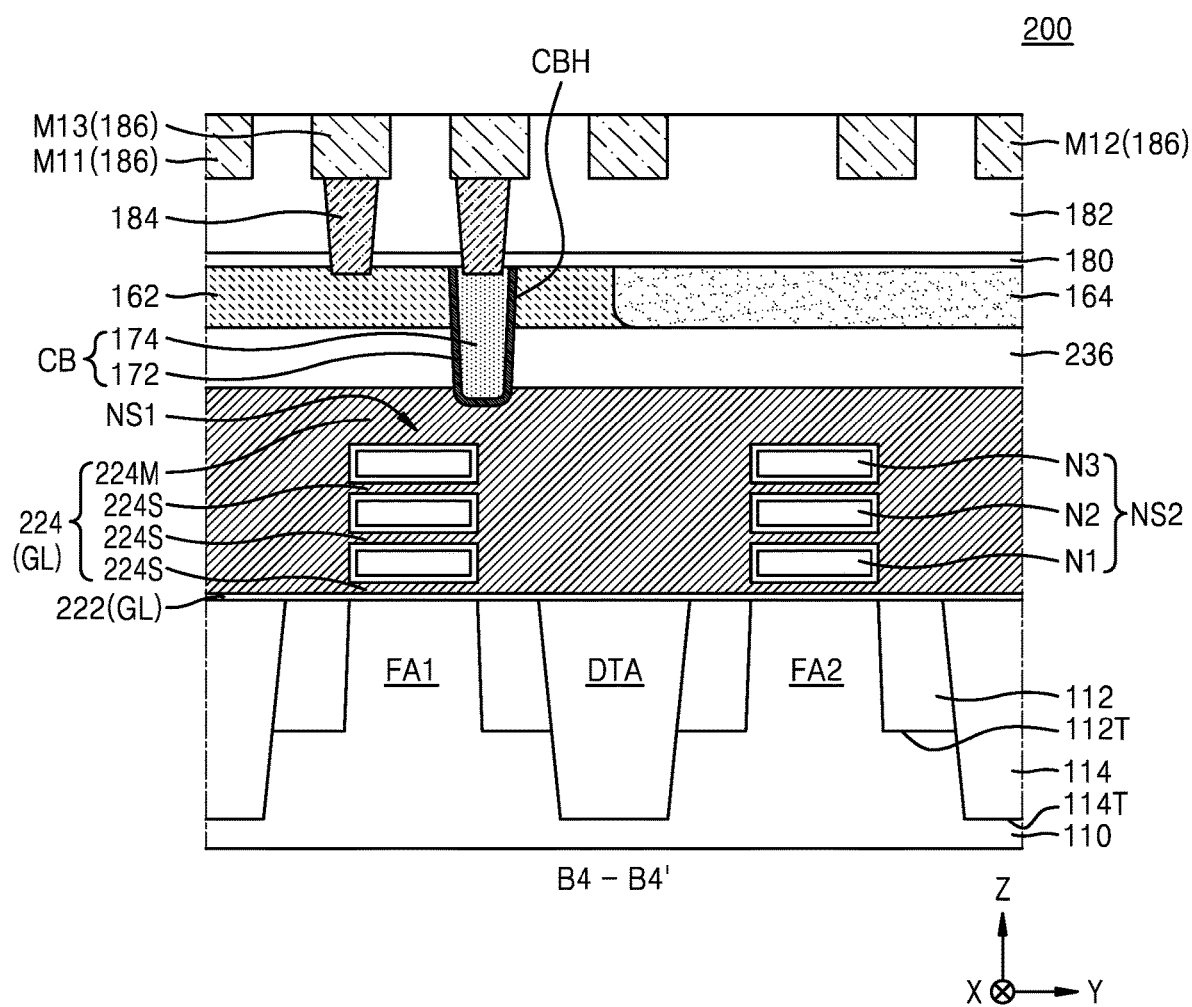
FIG. 10 is a cross-sectional view taken along line B4-B4' of FIG. 7.

FIG. 7 is a layout of an integrated circuit device 200 according to an embodiment of the inventive concept. FIG. 8 is a cross-sectional view taken along lines A3-A3' and A4-A4', FIG. 9 is a cross-sectional view taken along line B3-B3' of FIG. 7, and FIG. 10 is a cross-sectional view taken along line B4-B4' of FIG. 7. In FIG. 7 to FIG. 10, the same reference numerals as those of FIGS. 1 to 6 denote the same elements.

Referring to FIGS. 7 to 10, the substrate 110 may include the first active area RX1, the deep trench area DTA, and the second active area RX2. In the first active area RX1, the first fin-type active areas FA1 may be disposed extending in the first direction (X-direction), and in the second active area RX2, the second fin-type active areas FA2 may be disposed extending in the first direction (X-direction).

A plurality of first semiconductor patterns NS1 may be disposed on the first fin-type active areas FA1. The plurality of first semiconductor patterns NS1 may include first to third nano-sheets N1, N2, and N3 spaced apart from one another in a vertical direction (Z-direction) on the first fin-type active area FA1. The plurality of first semiconductor patterns NS1 may include the same material as that of the substrate 110. For example, the plurality of first semiconductor patterns NS1 may each include a semiconductor such as Si or Ge, or a compound semiconductor such as SiGe, SiC, GaAs, or InP. Each of the plurality of first semiconductor patterns NS1 may include a channel region.

The plurality of first semiconductor patterns NS1 may each have a relatively greater width in the second direction (Y-direction) and a relatively smaller thickness in a vertical direction (Z-direction), for example, may be provided in the form of a nano-sheet. In some embodiments, each of the plurality of first semiconductor patterns NS1 may have a width of about 5 nm to about 100 nm in the second direction (Y-direction) and a thickness of about 1 nm to about 10 nm in the vertical direction (Z-direction), but is not limited thereto.

A plurality of second semiconductor patterns NS2 may be disposed on the second fin-type active areas FA2. The plurality of second semiconductor patterns NS2 may include first to third nano-sheets N1, N2, and N3 spaced apart from one another in a vertical direction (Z-direction) on the second fin-type active area FA2. The plurality of second semiconductor patterns NS2 may include the same material as that of the substrate 110. Each of the plurality of second semiconductor patterns NS2 may include a channel region.

The gate structure GL may extend on the first fin-type active areas FA1 in the second direction (Y-direction) while surrounding the plurality of first semiconductor patterns NS1 and the plurality of second semiconductor patterns NS2. The gate structure GL may include a gate insulating layer 222 and a gate electrode 224. The gate electrode 224 may include a main gate portion 224M covering upper surfaces of the uppermost first semiconductor patterns NS1 and the uppermost second semiconductor patterns NS2 (that is, the third nano-sheets N3), and a plurality of sub-gate portions 224S respectively formed in a space between two adjacent first semiconductor patterns NS1 and a space between two adjacent second semiconductor patterns NS2.

The gate insulating layer 222 is disposed on the upper surface of the first fin-type active area FA1 and the upper surface of the second fin-type active area FA2, and may extend onto the isolation layer 112 and the deep trench insulation layer 114. The gate insulating layer 222 may be between the plurality of sub-gate portions 224S and the plurality of first semiconductor patterns NS1, and between the plurality of sub-gate portions 224S and the plurality of second semiconductor patterns NS2.

First recess regions RS1 may be formed on the first fin-type active areas FA1 at opposite sides of the plurality of first semiconductor patterns NS1, and the first source/drain region SD1 may be filled in each of the first recess regions RS1. The first source/drain region SD1 may be connected to ends of the plurality of first semiconductor patterns NS1. The first source/drain region SD1 may be formed by growing a semiconductor layer through a selective epitaxial growth (SEG) process from the first fin-type active area FA1 and the plurality of first semiconductor patterns NS1. Also, second recess regions RS2 may be formed on the second fin-type active areas FA2 at opposite sides of the plurality of second semiconductor patterns NS2, and the second source/drain region SD2 may be filled in each of the second recess regions RS2. The first source/drain region SD1 and the second source/drain region SD2 may each include an epitaxially grown Si layer, an epitaxially grown SiC layer, and an embedded SiGe structure including a plurality of epitaxially grown SiGe layers, etc.

Gate spacers 232 are on opposite side walls of the main gate portion 224M of the gate electrode 224, and may be between the sub-gate portions 224S of the gate electrode 224 and the first source/drain region SD1 and between the sub-gate portions 224S of the gate electrode 224 and the second source/drain region SD2. A gate capping layer 236 may be disposed on the gate structure GL and the gate spacers 232.

The first source/drain contact CA1 may be disposed on the first source/drain region SD1 and in the source/drain contact hole CAH that penetrates through the inter-gate insulating layer 142, and the second source/drain contact CA2 may be disposed on the second source/drain region SD2 and in the source/drain contact hole CAH penetrating through the inter-gate insulating layer 142. The first source/drain contact CA1 and the second source/drain contact CA2 may each include the first portion 150P1 and the second portion 150P2, wherein the second portion 150P2 has an upper surface at a lower level (relative to the substrate 110) than that of the first portion 150P1.

The first stressor layer 162 may be disposed on the upper surface of the second portion 150P2 of the first source/drain contact CA1 and a convex upper surface of the gate capping layer 236, wherein the convex upper surface is adjacent to the upper surface of the second portion 150P2, on the first fin-type active area FA1. The second stressor layer 164 may be disposed on the upper surface of the second portion 150P2 of the second source/drain contact CA2 and a convex upper surface of the gate capping layer 236, wherein the convex upper surface is adjacent to the upper surface of the second portion 150P2, on the second fin-type active area FA2.

The gate contact CB may be in the gate contact hole CBH that penetrates through the first stressor layer 162 and the gate capping layer 236, and a bottom portion of the gate contact CB may be connected to the main gate portion 224M of the gate electrode 224.

According to the above embodiments, even when the gate contact CB is disposed on the first fin-type active area FA1, a sufficient separation distance may be ensured between the gate contact CB and the first portion 150P1 of the first source/drain contact CA1. Therefore, an area of the deep trench area DTA may be reduced and the height of the integrated circuit device 200 may be reduced. Moreover, the first stressor layer 162 covering the upper surface of the second portion 150P2 of the first source/drain contact CA1 and the second stressor layer 164 covering the upper surface of the second portion 150P2 of the second source/drain contact CA2 respectively apply tensile stress and compressive stress to the NMOS transistor and the PMOS transistor, and thus, the electrical performance of the integrated circuit device 200 may be optimized.

Figure 11:
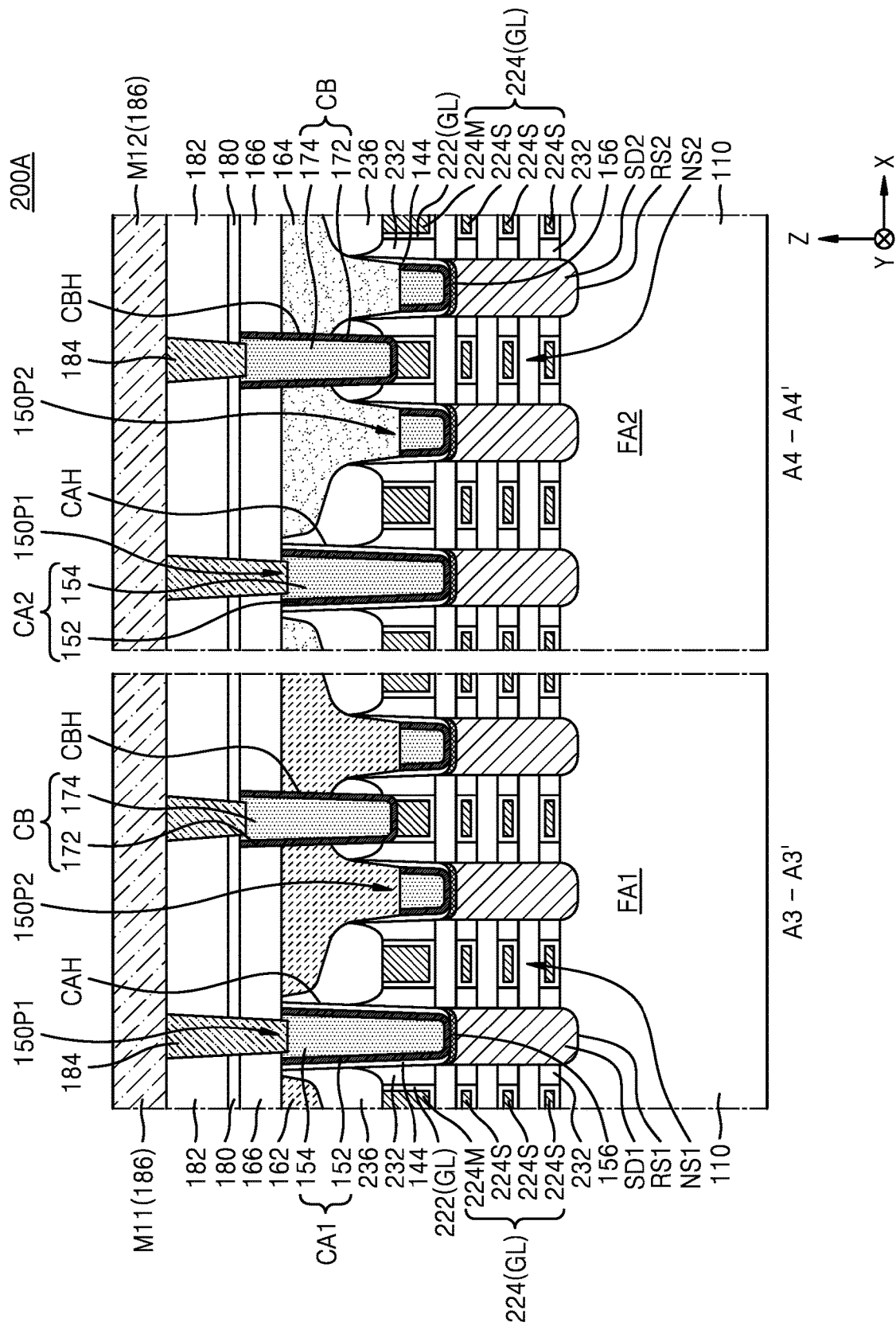
FIG. 11 is a cross-sectional view of an integrated circuit device according to an embodiment of the inventive concept.

FIG. 11 is a cross-sectional view of an integrated circuit device 200A according to an embodiment of the inventive concept. In FIG. 11, the same reference numerals as those of FIGS. 1 to 10 denote the same elements.

Referring to FIG. 11, the interlayer insulating layer 166 is disposed on the first stressor layer 162, the second stressor layer 164, and the first and second source/drain contacts CA1 and CA2, and the etch stop layer 180 may be disposed on the interlayer insulating layer 166. The gate contact hole CBH penetrates through the interlayer insulating layer 166, the first stressor layer 162, and the gate capping layer 236, and the upper surface of the gate contact CB may be at a higher level (relative to the substrate 110) than the upper surfaces of the first and second source/drain contacts CA1 and CA2.

FIGS. 12A to 23B are cross-sectional views illustrating a method of manufacturing the integrated circuit device 100, according to an embodiment of the inventive concept. In detail, FIGS. 12A, 13A, 14A, 15A, 16A, 17A, 18A, 19A, 20A, 21A, 22A, and 23A show cross-sections taken along lines A1-A1' and A2-A2' of FIG. 1, FIGS. 12B, 13B, 14B, 15B, 16B, 17B, 18B, 19B, 20B, and 21B show cross-sections taken along line B1-B1' of FIG. 1, and FIGS. 22B and 23B show cross-sections taken along line B2-B2' of FIG. 1.

Figure 12A:
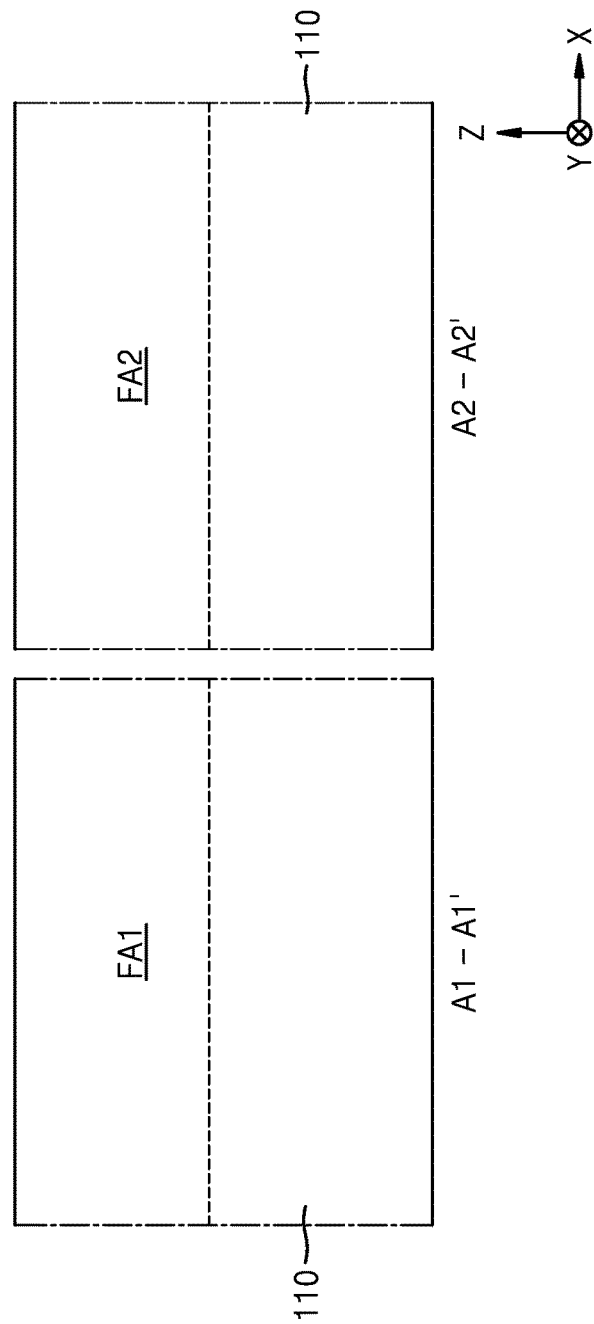
Figure 12B:
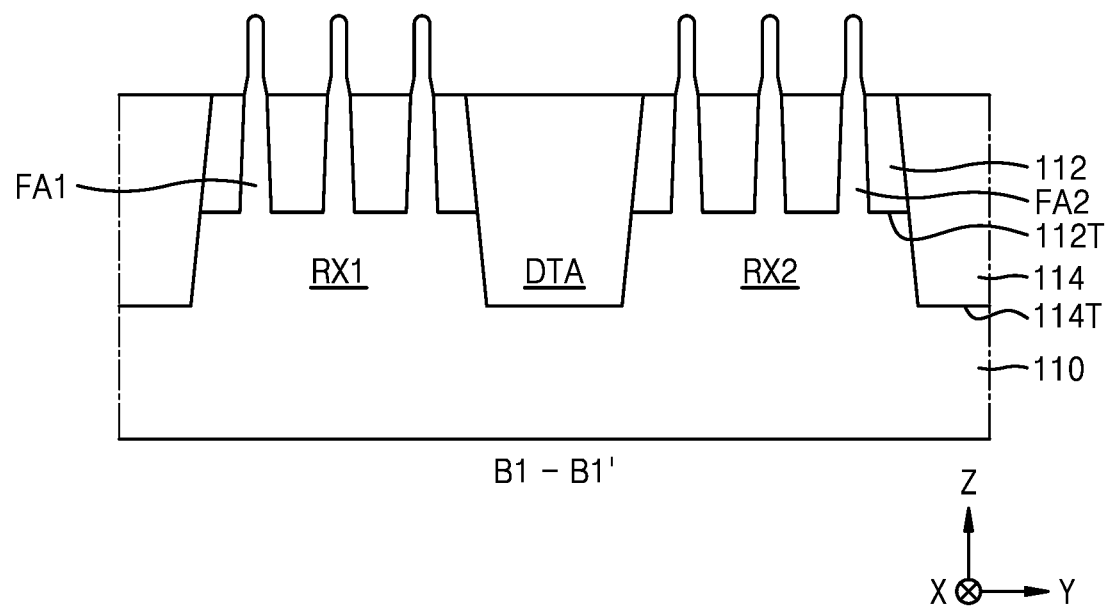

Referring to FIGS. 12A and 12B, a mask pattern is formed on the upper surface of the substrate 110, and the substrate 110 is removed to a certain depth by using the mask pattern as an etching mask to form an isolation trench 112T and to form the first fin-type active area FA1 and the second fin-type active area FA2.

After that, the isolation layer 112 covering opposite side walls of the first and second fin-type active areas FA1 and FA2 may be formed on the substrate 110. Although not shown in the drawings, an interfacial layer that conformally covers the side walls of the first and second fin-type active areas FA1 and FA2 may be further formed between the isolation layer 112 and the first and second fin-type active areas FA1 and FA2.

In some embodiments, the isolation layer 112 may include an oxide layer that is formed by a flowable chemical vapor deposition (FCVD) process or a spin-coating process. For example, the isolation layer 112 may include, but is not limited to, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or Tonen SilaZene (TOSZ).

After that, the isolation layer 112 and the substrate 110 are partially removed from the deep trench area DTA to form the deep trench 114T, and the deep trench 114T is filled with an insulating material to form the deep trench insulation layer 114.

In addition, upper portions of the isolation layer 112 and the deep trench insulation layer 114 may be removed to certain depths by a recess process.

Figure 13A:
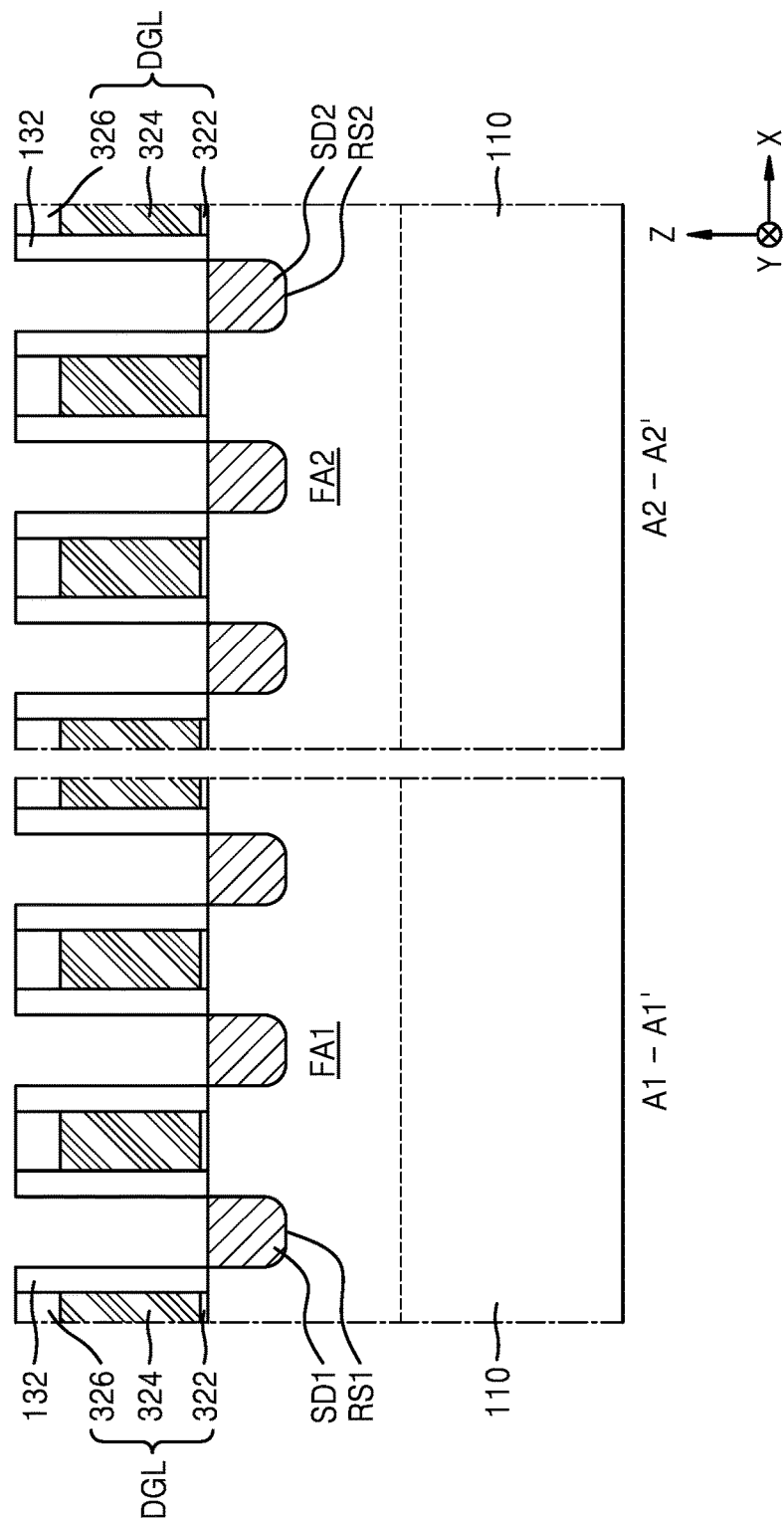
Figure 13B:
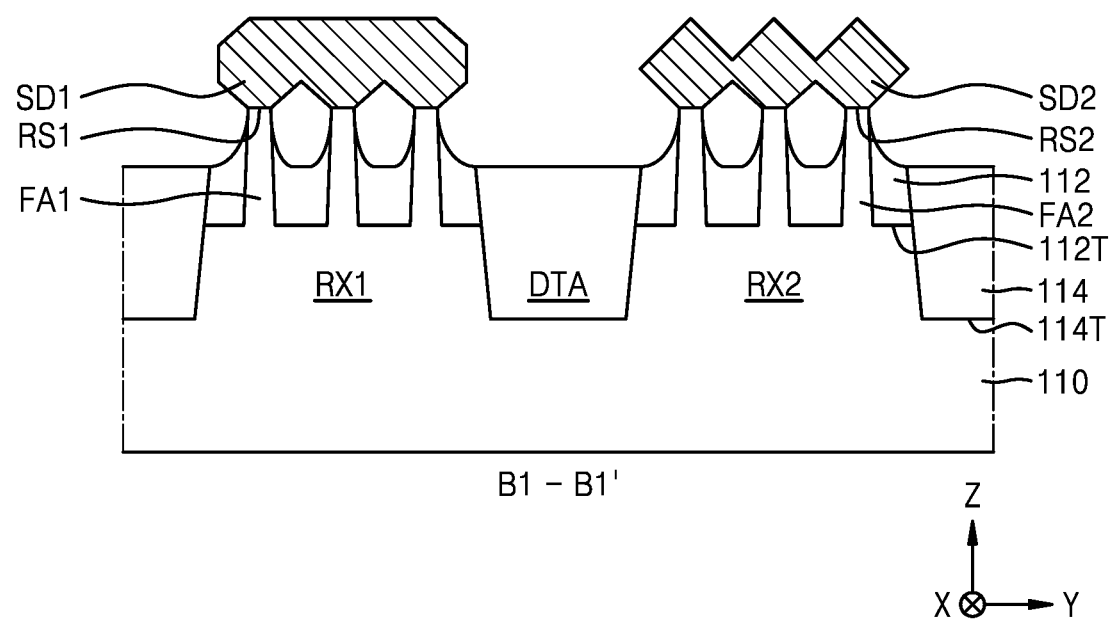

Referring to FIG. 13A and FIG. 13B, a sacrificial gate insulating layer, a sacrificial gate conductive layer, and a hard mask pattern 326 are sequentially formed on the substrate 110, and after that, the sacrificial gate conductive layer and the sacrificial gate insulating layer are patterned by using the hard mask pattern 326 as an etching mask to form a sacrificial gate 324 and a sacrificial gate insulating layer pattern 322. Here, the sacrificial gate insulating layer pattern 322, the sacrificial gate 324, and the hard mask pattern 326 are referred to as a sacrificial gate structure DGL.

After that, an insulating layer covering the sacrificial gate structure DGL is formed by an ALD process or a chemical vapor deposition (CVD) process, and an anisotropic etching process is performed on the insulating layer to form the gate spacer 132 on a side wall of the sacrificial gate structure DGL. The gate spacer 132 may include silicon nitride, but is not limited thereto.

The first fin-type active areas FA1 at opposite sides of the sacrificial gate structure DGL are partially etched to form the first recess regions RS1, and the second fin-type active areas FA2 at opposite sides of the sacrificial gate structure DGL are partially etched to form the second recess regions RS2.

After that, the first source/drain region SD1 is formed in each of the first recess regions RS1, and the second source/drain region SD2 may be formed in each of the second recess regions RS2. In some embodiments, the first and/or second source/drain regions SD1 and SD2 may be formed by an epitaxy process using the side walls of the first and second fin-type active areas FA1 and FA2 and the upper surface of the substrate 110, which are exposed through internal walls of the first and second recess portions RS1 and RS2, as seed layers. The epitaxy process may include a CVD process such as vapor-phase epitaxy (VPE), ultra-high vacuum chemical vapor deposition (UHV-CVD), etc., molecular beam epitaxy, or combinations thereof. In the epitaxy process, a liquid phase or gas phase precursor may be used as a precursor for forming the first and second source/drain regions SD1 and SD2.

After that, an insulating layer covering the sacrificial gate structure DGL is formed on the substrate 110, and the insulating layer is planarized so that an upper surface of the hard mask pattern 326 is exposed to form the inter-gate insulating layer 142.

Figure 14A:
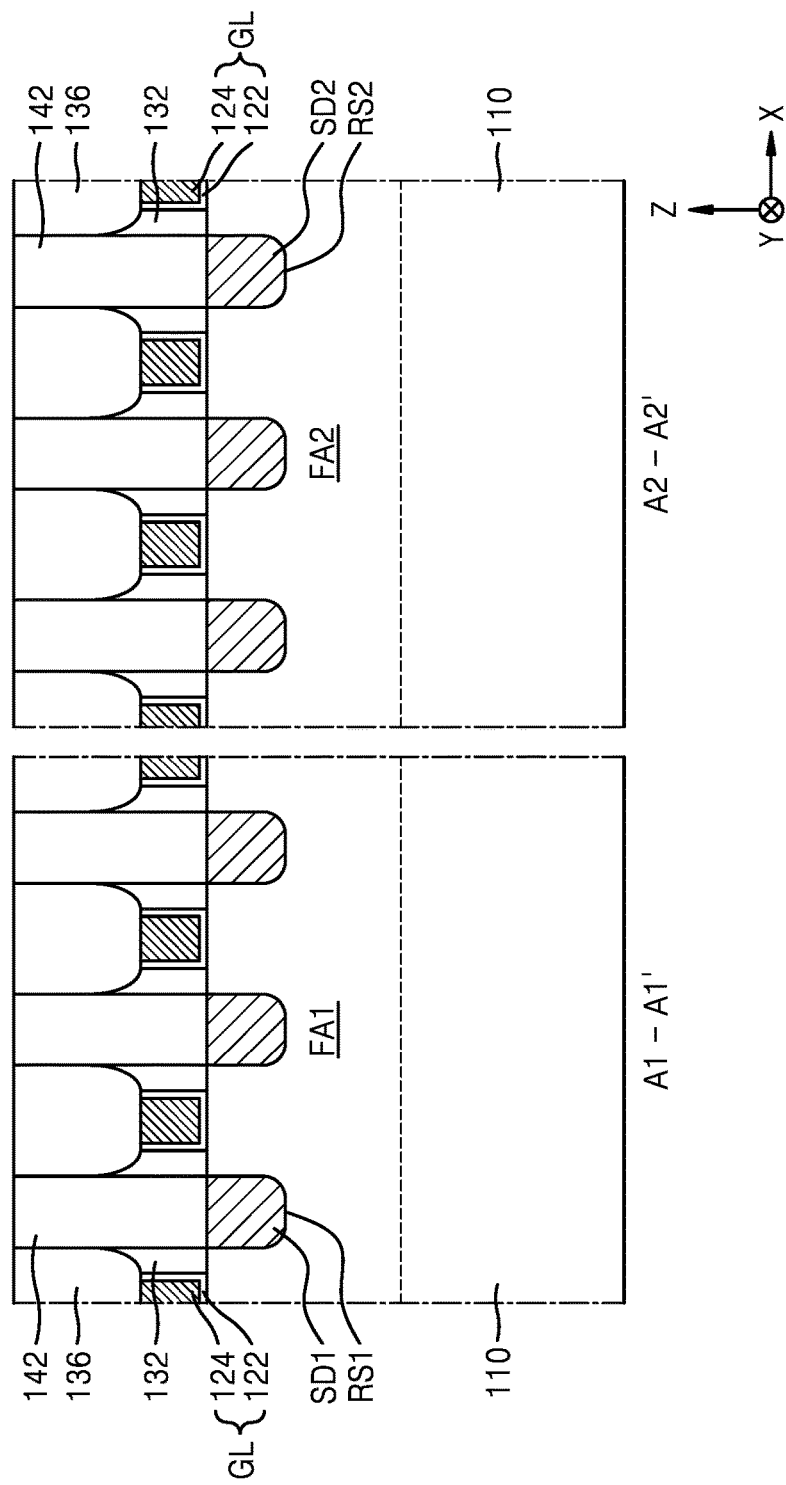
Figure 14B:
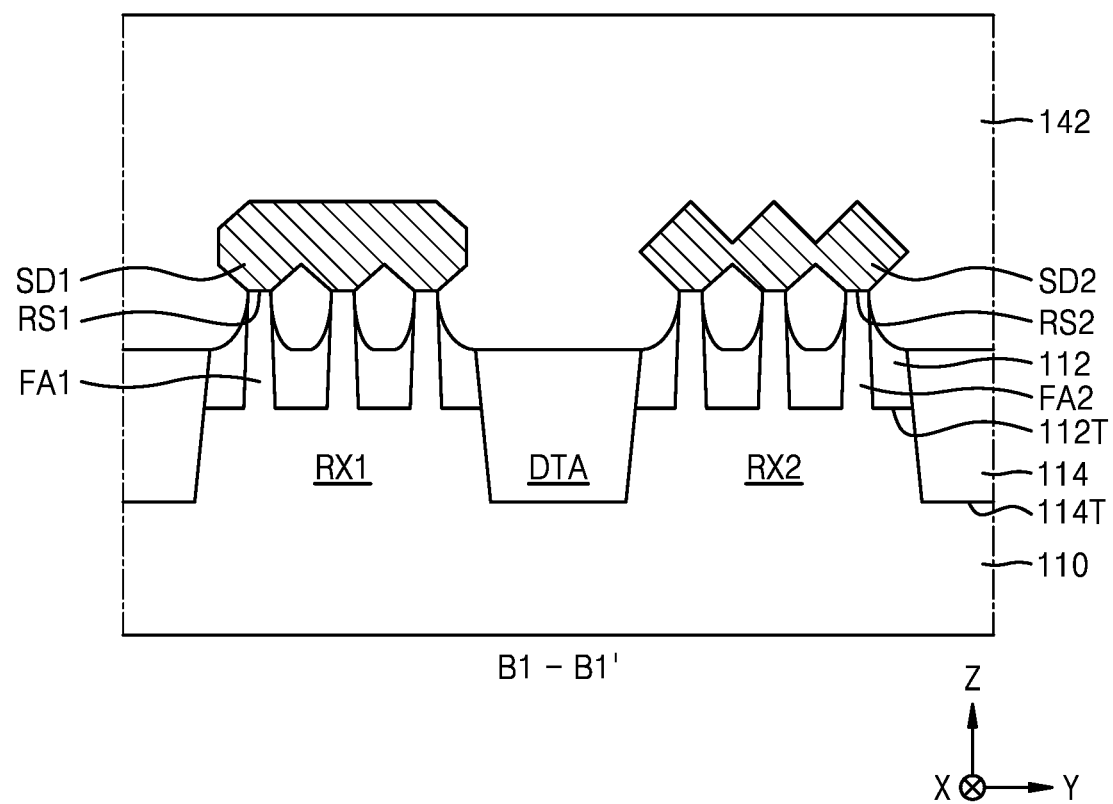

The hard mask pattern 326, the sacrificial gate 324, and the sacrificial gate insulating layer pattern 322 are removed to form a gate space defined between the side walls of a pair of gate spacers 132, and the gate insulating layer 122 may be formed on an internal wall of the gate space. A conductive layer filled in the gate space is formed on the gate insulating layer 122, and an upper portion of the conductive layer is planarized so that an upper surface of the inter-gate insulating layer 142 is exposed to form the gate electrode 124. After that, as shown in FIGS. 14A and 14B, the upper portion of the gate electrode 124 and the upper portion of the gate spacer 132 are etched back to expand an upper entrance of the gate space in a lateral direction, and the gate capping layer 136 filling the upper entrance of the gate space may be formed.

Figure 15A:
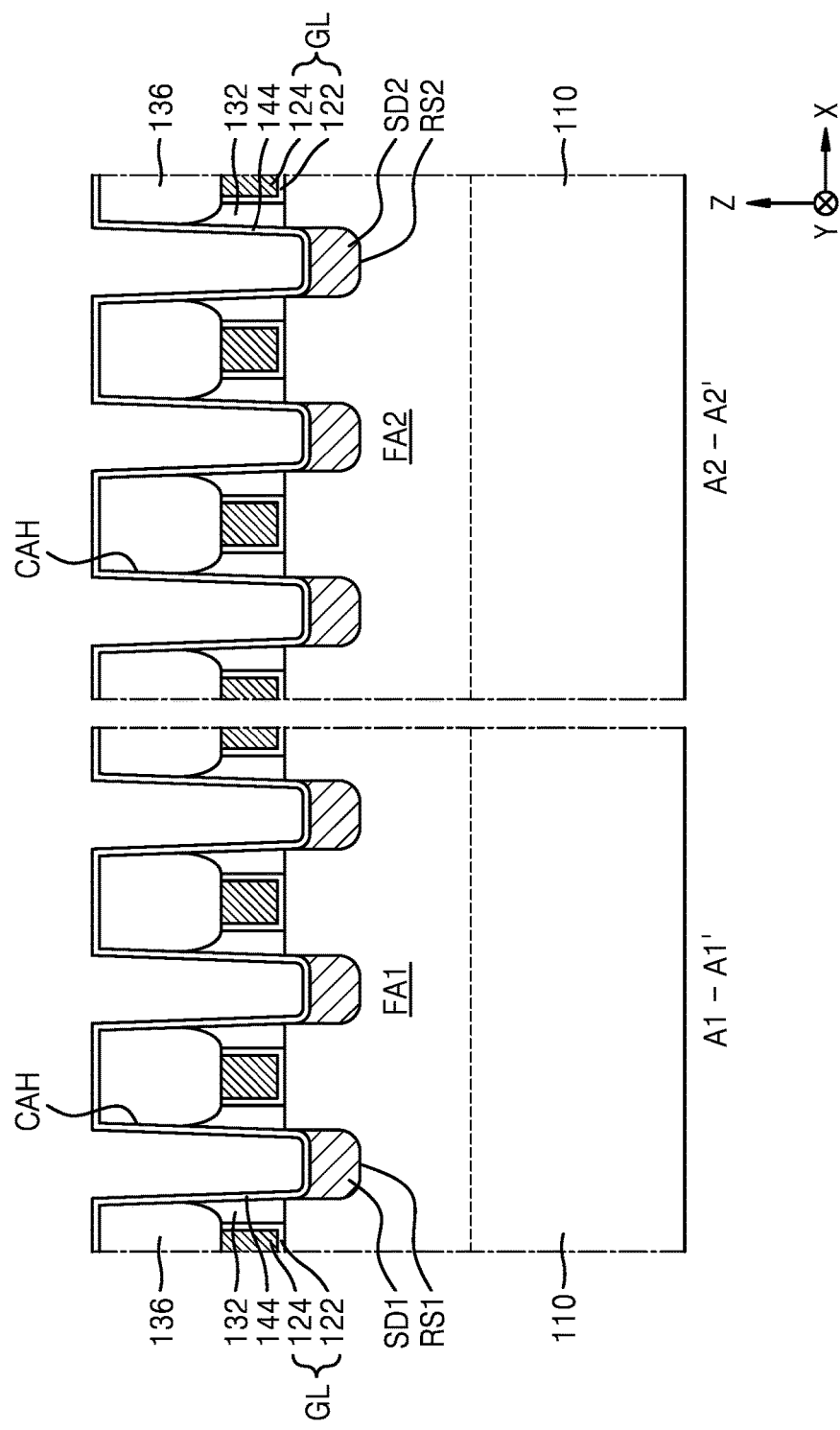
Figure 15B:
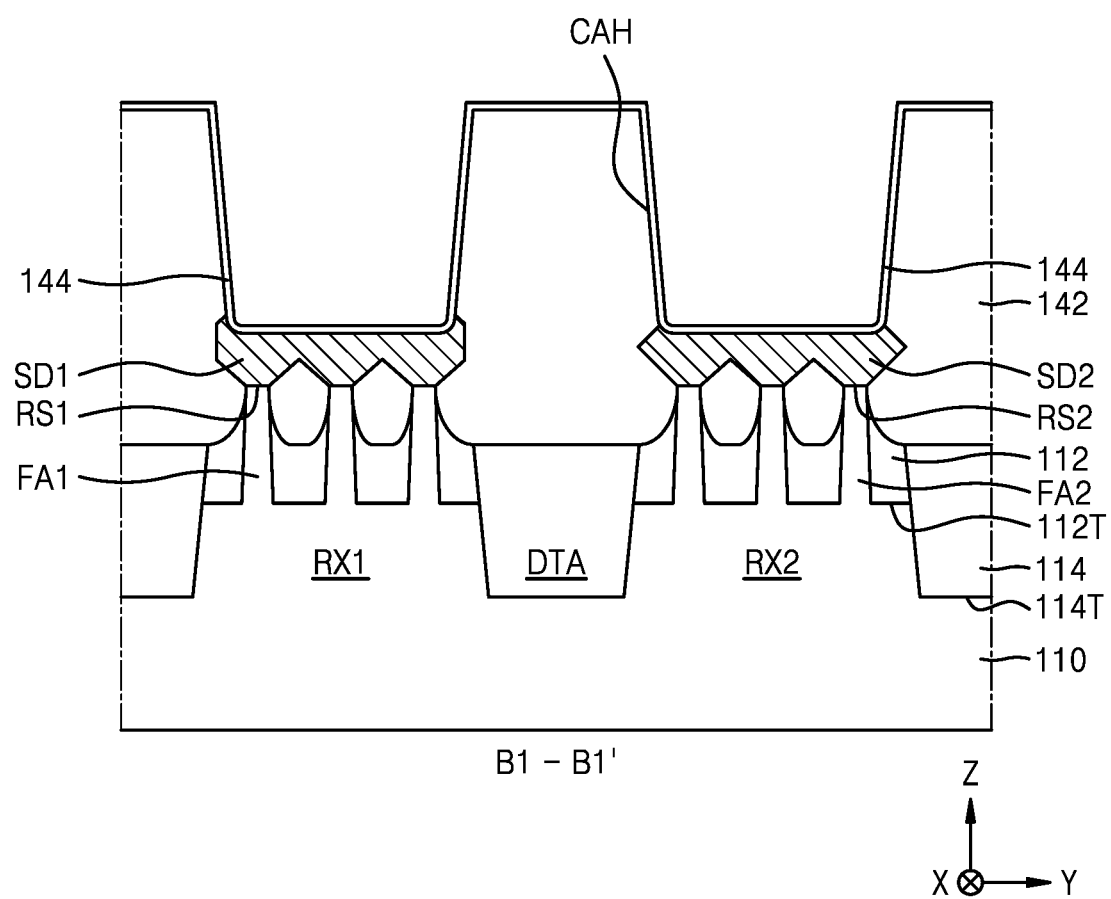

Referring to FIGS. 15A and 15B, a mask pattern is formed on the gate capping layer 136 and the inter-gate insulating layer 142, and the inter-gate insulating layer 142 is partially etched by using the mask pattern as an etching mask to form a source/drain contact hole CAH that exposes the upper surfaces of the first and second source/drain regions SD1 and SD2.

After that, the contact liner 144 that may conformally cover the internal wall of the source/drain contact hole CAH may be formed on the gate capping layer 136 and the inter-gate insulating layer 142. The contact liner 144 may be formed of a metal material including Ti, W, Ru, Nb, Mo, Hf, Ni, Co, Pt, Yb, Tb, Dy, Er, and/or Pd.

Figure 16A:
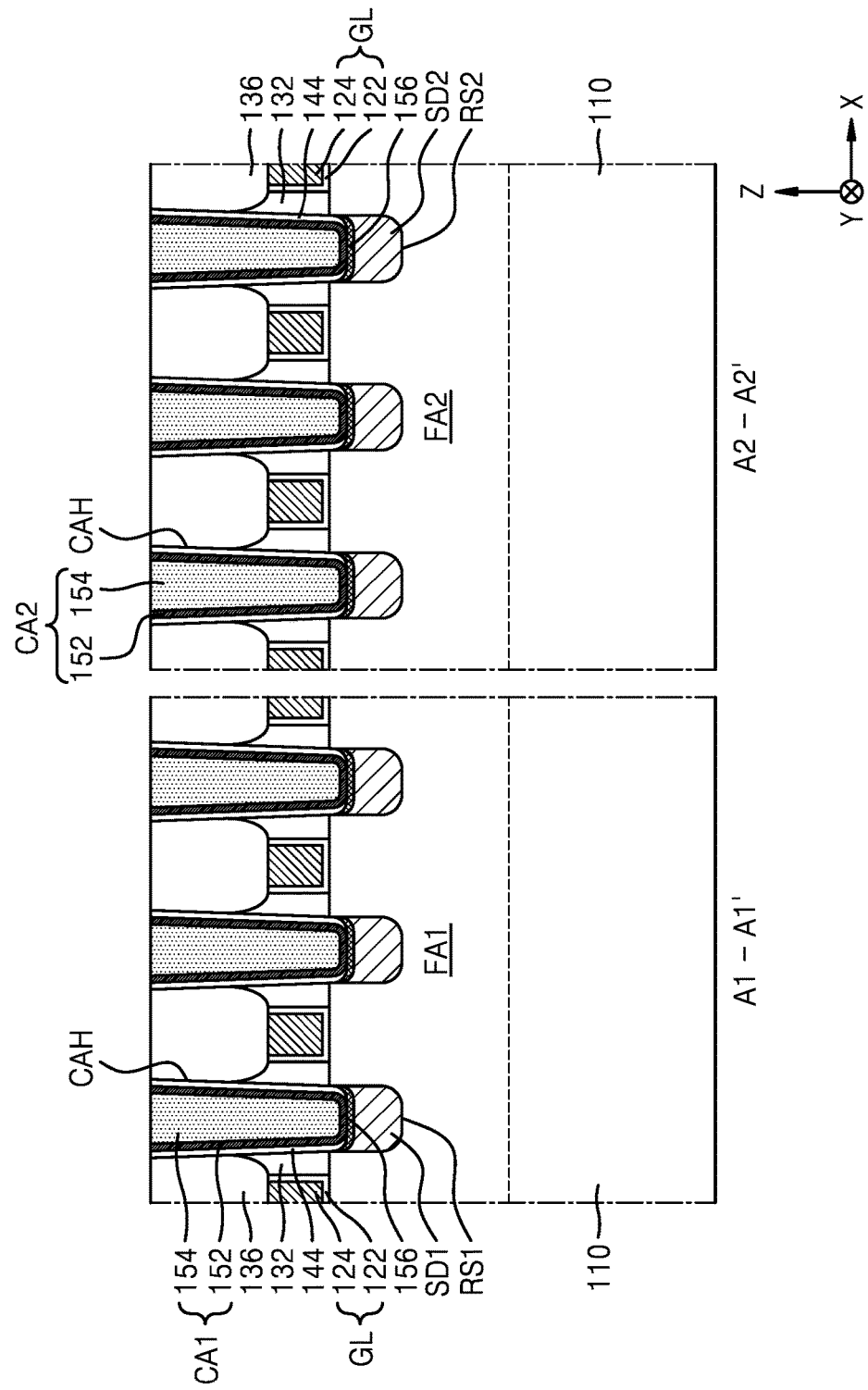
Figure 16B:
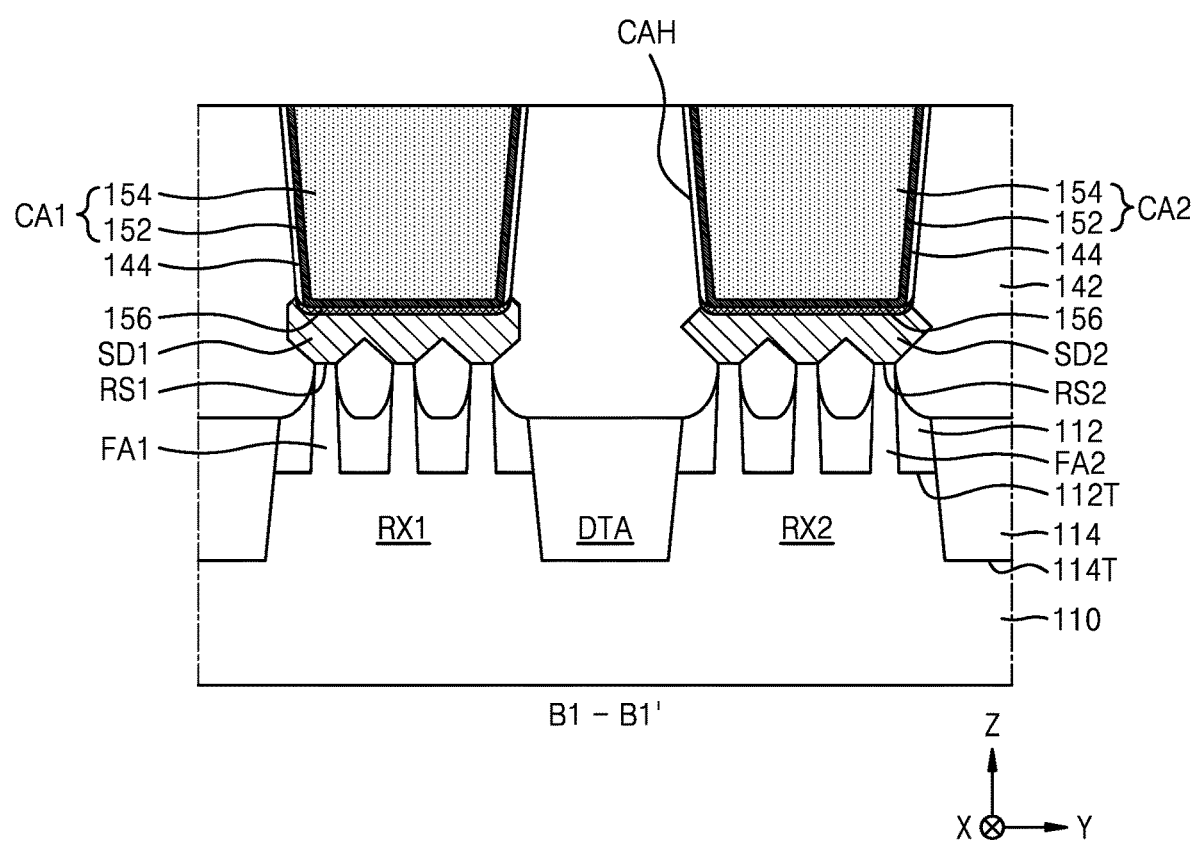

Referring to FIGS. 16A and 16B, the conductive barrier layer 152 may be formed on the internal wall of the source/drain contact hole CAH.

After that, a resultant in which the conductive barrier layer 152 is formed is thermally treated to induce a reaction between the metal material included in the contact liner 144 and the semiconductor material included in the first and second source/drain regions SD1 and SD2, and then, the metal silicide layer 156 covering the upper surfaces of the first and second source/drain regions SD1 and SD2 may be formed.

In addition, a metal material filling in the source/drain contact hole CAH is formed on the conductive barrier layer 152, and an upper portion of the metal layer is planarized so as to expose the upper surfaces of the inter-gate insulating layer 142 and the gate capping layer 136 and to form the contact plug 154.

Referring to FIGS. 17A and 17B, the mask pattern 330 partially covering the first source/drain contact CA1 and the second source/drain contact CA2 may be formed. In some embodiments, an etch stop layer is formed on some parts of the first source/drain contact CA1 and the second source/drain contact CA2, wherein the etch stop layer includes SiOC, SiN, or combinations thereof, and the mask pattern 330 may be formed on the etch stop layer. The mask pattern 330 may include a silicon oxide layer, a spin on hardmask (SOH) layer, a photoresist layer, or combinations thereof, but is not limited thereto.

A recess process for etching the first source/drain contact CA1 and the second source/drain contact CA2 is performed by using the mask pattern 330 as an etching mask, and thus, the heights or thicknesses of portions of the first source/drain contact CA1 and the second source/drain contact CA2 that are not covered by the mask pattern 330 may be reduced. Due to the recess process, the first source/drain contact CA1 and the second source/drain contact CA2 may be formed to each have the first portion 150P1 and the second portion 150P2 having different upper surface levels from each other (relative to the substrate 110). The first portion 150P1 is a portion that is covered by the mask pattern 330 and has a height that is not reduced during the recess process, and the second portion 150P2 may correspond to a portion that is exposed to an etching atmosphere during the recess portion and has a reduced height. As the height of the second portion 150P2 is reduced by the recess process, the upper portion of the source/drain contact hole CAH may be exposed again.

The recess process may be a selective etching process having an etching atmosphere or etch chemistry in which an etching amount of the metal material included in the contact plug 154 is greater than that of the gate capping layer 136. The upper portion of the gate capping layer 136 may be partially removed due to the recess process, and thus, the gate capping layer 136 may have a convex upper surface.

Also, in the recess process, the inter-gate insulating layer 142 may be partially removed also. However, in some embodiments, an etching amount of the inter-gate insulating layer 142 may be negligible (in contrast to the example shown in FIG. 17B), and thus, the upper surface of the inter-gate insulating layer 142 may be substantially at a level that is the same as or similar to that of the upper surface of the first portion 150P1.

Figure 18A:
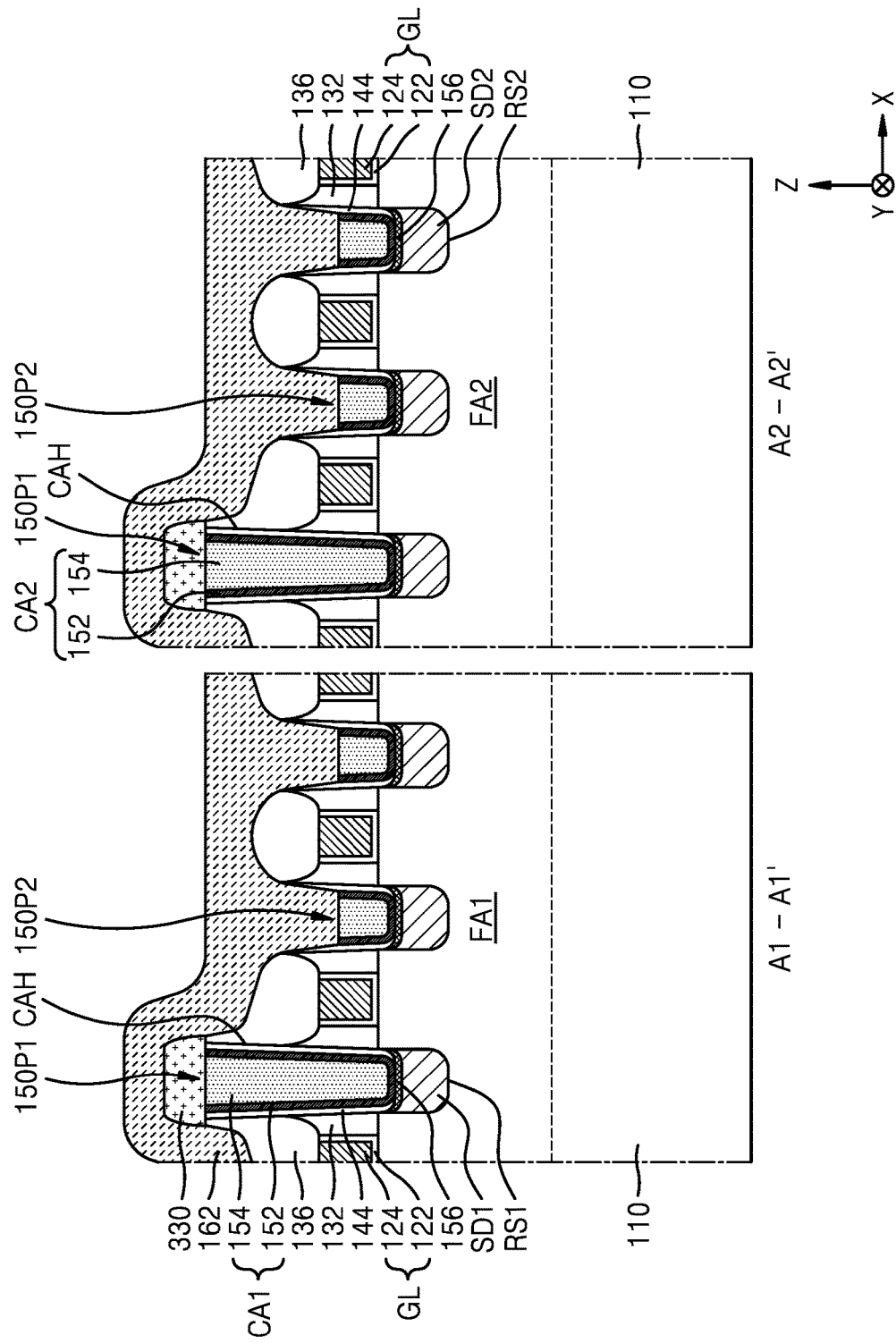
Figure 18B:
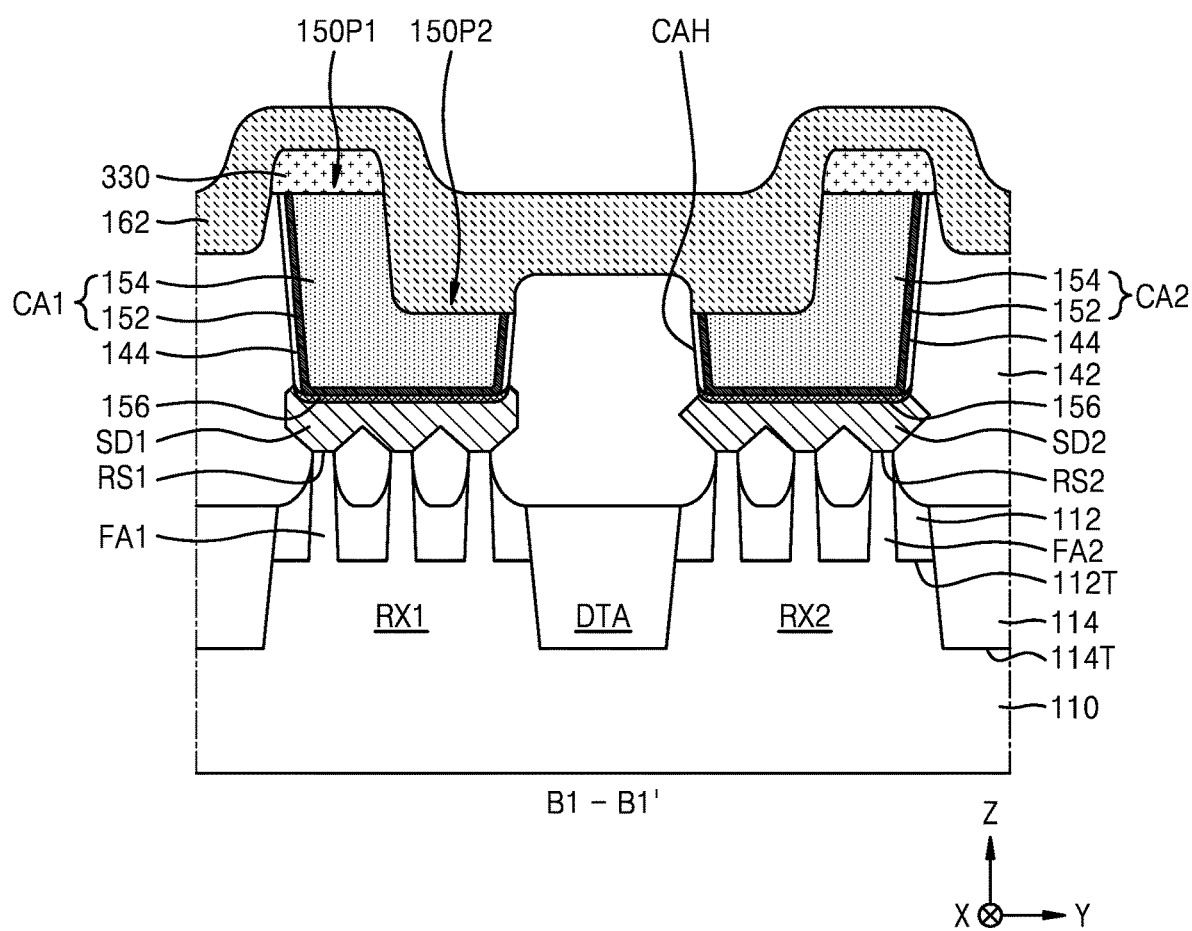

Referring to FIGS. 18A and 18B, the first stressor layer 162 may be formed on exposed surfaces of the first source/drain contact CA1, the second source/drain contact CA2, the gate capping layer 136, and the inter-gate insulating layer 142. The first stressor layer 162 may be formed to completely fill the upper portion of the source/drain contact hole CAH, which was exposed over the second portion 150P2 of the first source/drain contact CA1, and the upper portion of the source/drain contact hole CAH, which was exposed over the second portion 150P2 of the second source/drain contact CA2.

In some embodiments, the first stressor layer 162 may include SiOC, SiON, SiCN, SiN, TOSZ, TEOS, ALD oxide, FCVD oxide, HDP oxide, and/or PEOX oxide.

Figure 19A:
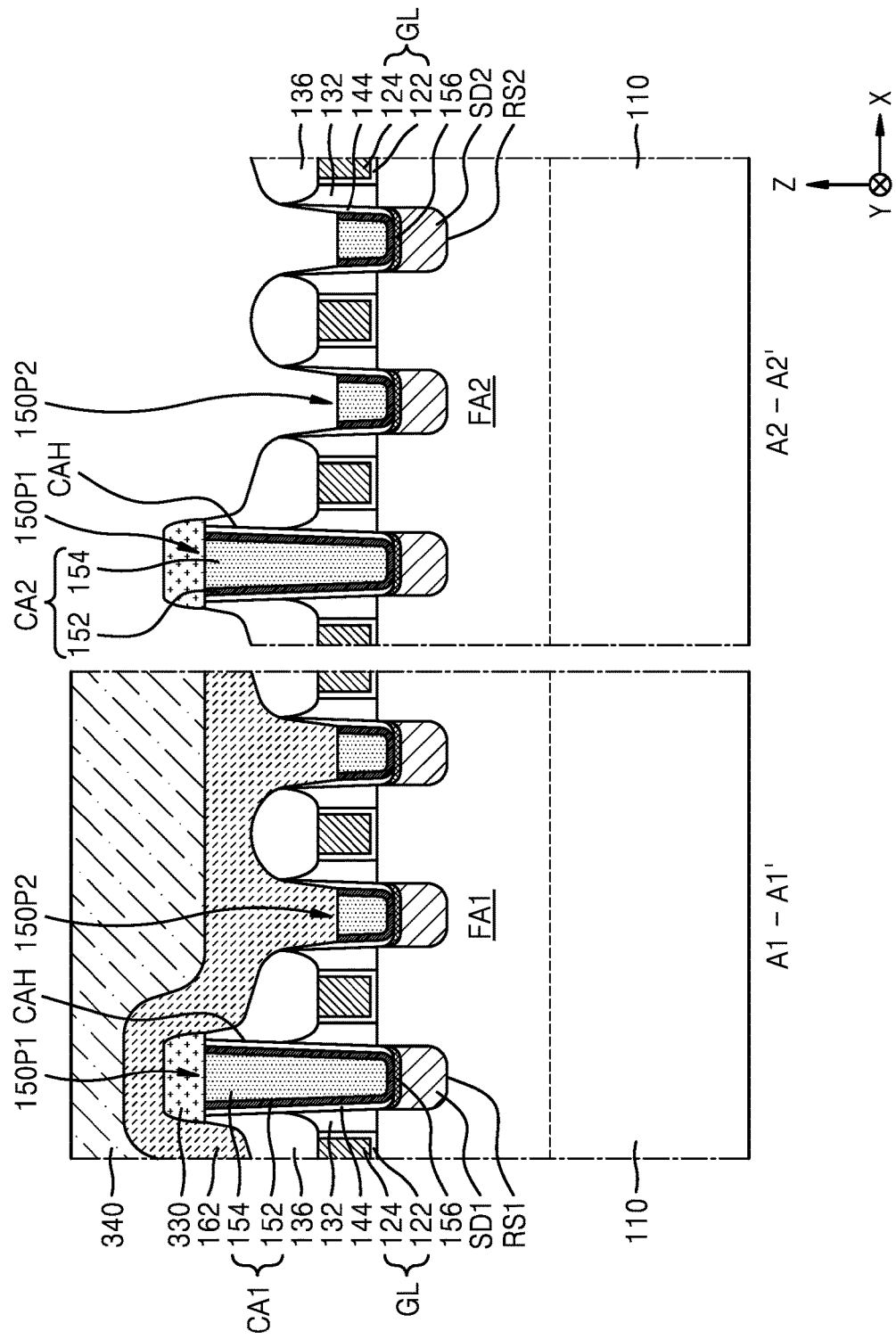
Figure 19B:
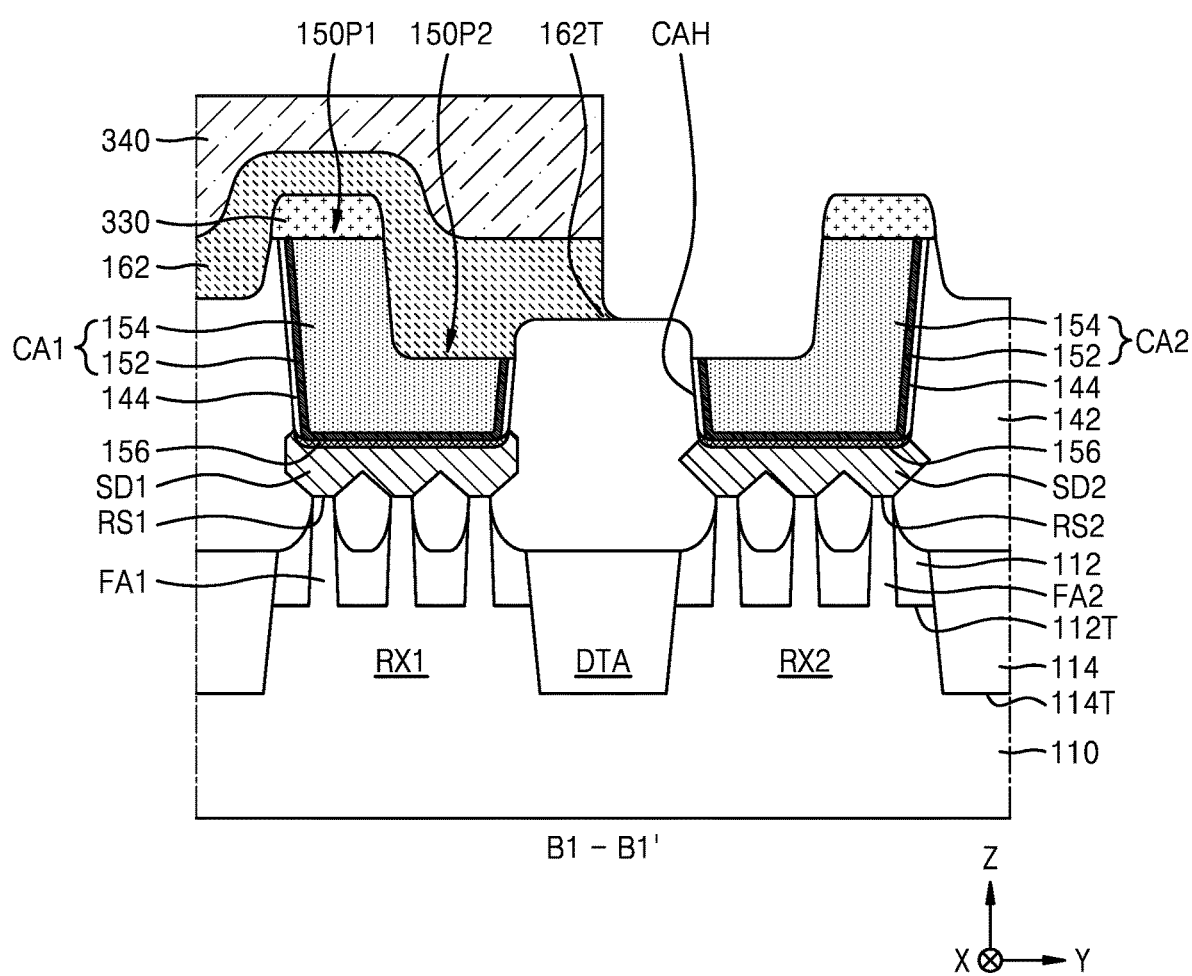

Referring to FIGS. 19A and 19B, a mask pattern 340 covering the first active area RX1 may be formed. The mask pattern 340 may be disposed to partially expose the second active area RX2 and the deep trench area DTA. After that, the first stressor layer 162 disposed on the second active area RX2 and the deep trench area DTA is removed by using the mask pattern 340 as an etching mask, and the second source/drain contact CA2, the gate capping layer 136, and the inter-gate insulating layer 142 may be exposed.

In some embodiments, the tail portion 162T may be formed on the side wall of the first stressor layer 162 under or adjacent an edge portion of the mask pattern 340 during the process of removing the first stressor layer 162. Then, the mask pattern 340 may be removed.

Figure 20A:
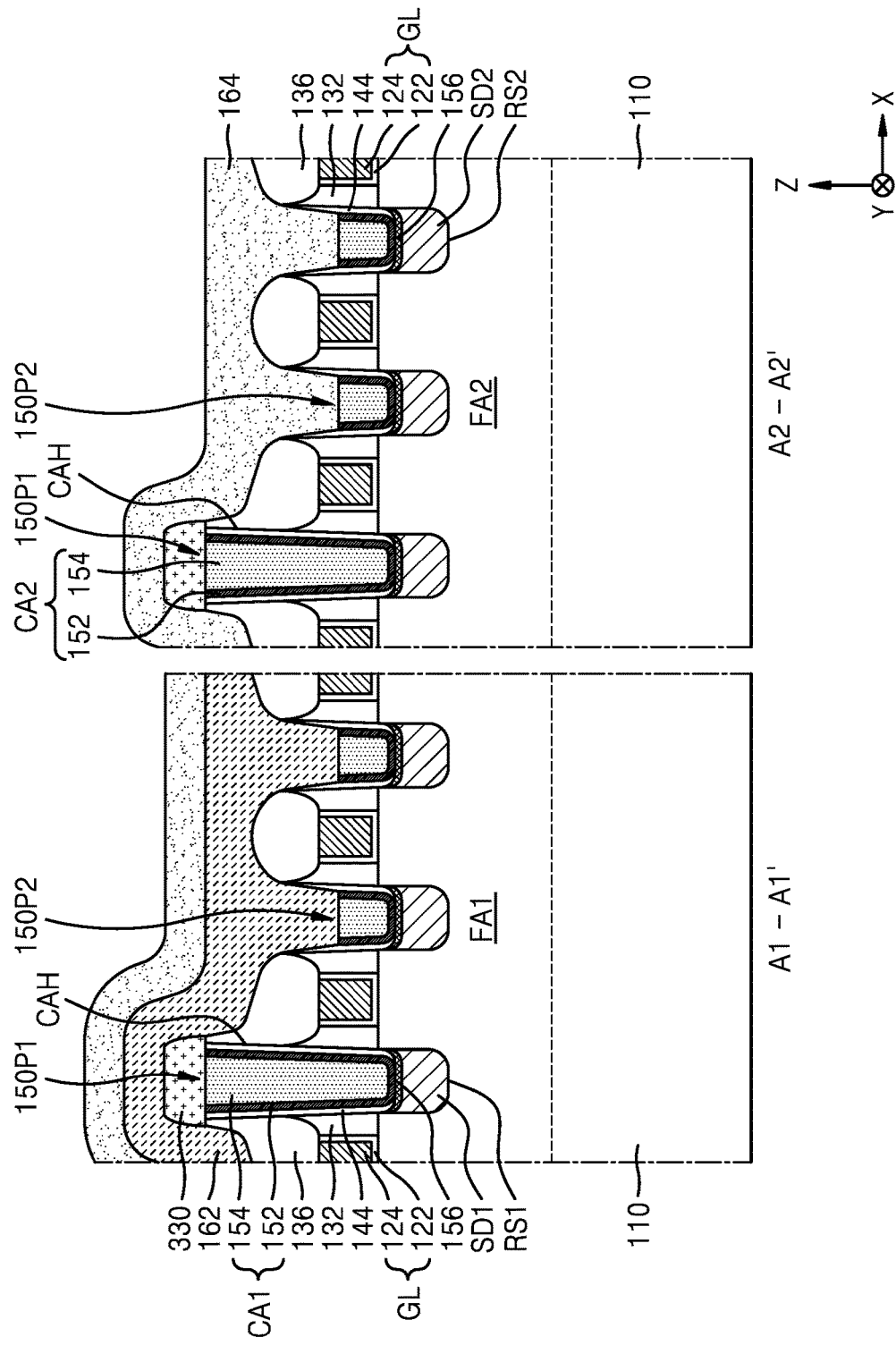
Figure 20B:
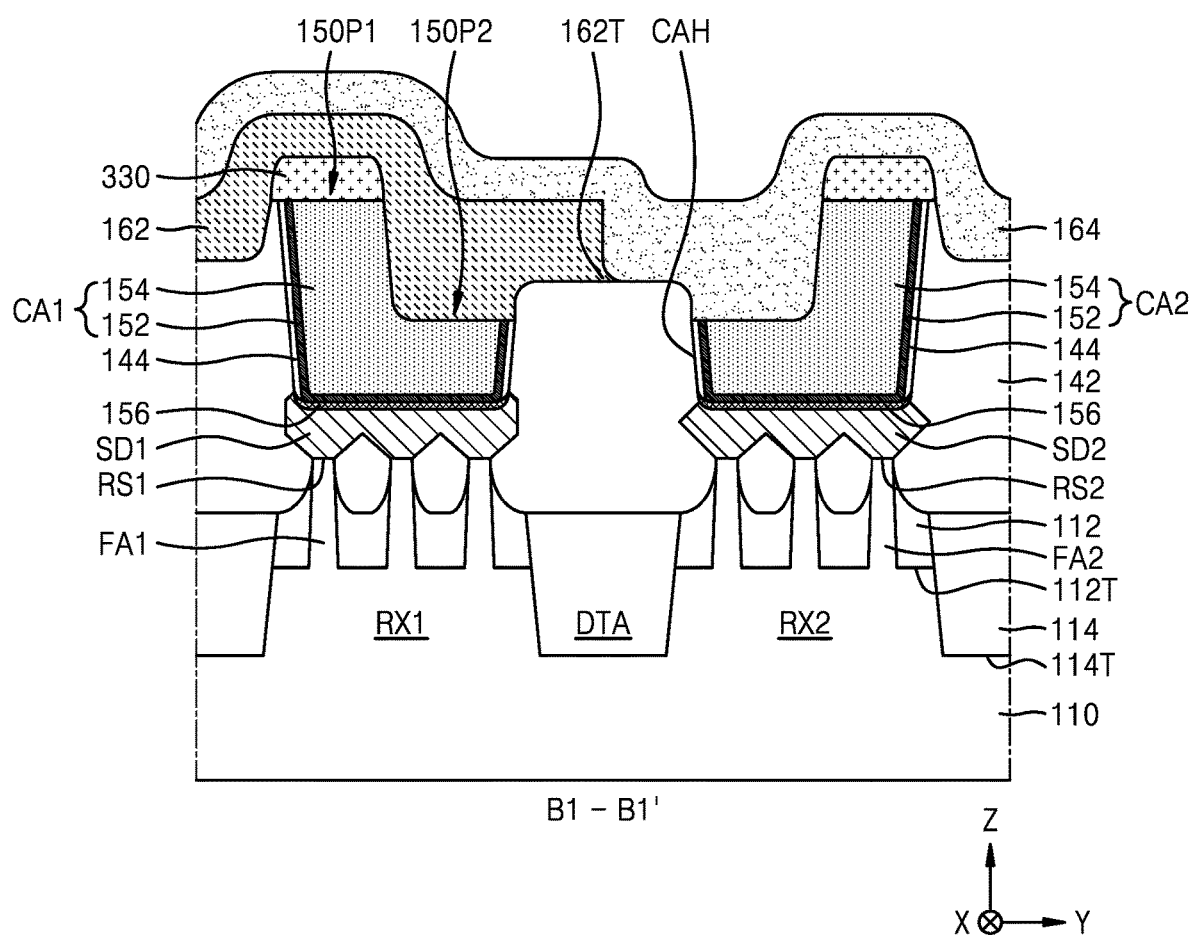

Referring to FIGS. 20A and 20B, the second stressor layer 164 may be formed on exposed surfaces of the first stressor layer 162, the second source/drain contact CA2, the gate capping layer 136, and the inter-gate insulating layer 142. The second stressor layer 164 may be formed to completely fill the upper portion of the source/drain contact hole CAH, which was exposed over the second portion 150P2 of the second source/drain contact CA2.

In some embodiments, the second stressor layer 164 may include SiOC, SiON, SiCN, SiN, Tonen SilaZene (TOSZ), tetraethyl orthosilicate (TEOS), atomic layer deposition (ALD) oxide, flowable chemical vapor deposition (FCVD) oxide, high density plasma (HDP) oxide, and/or plasma enhanced oxidation (PEOX) oxide. The second stressor layer 164 may include a material that is different from that of the first stressor layer 162.

Figure 21A:
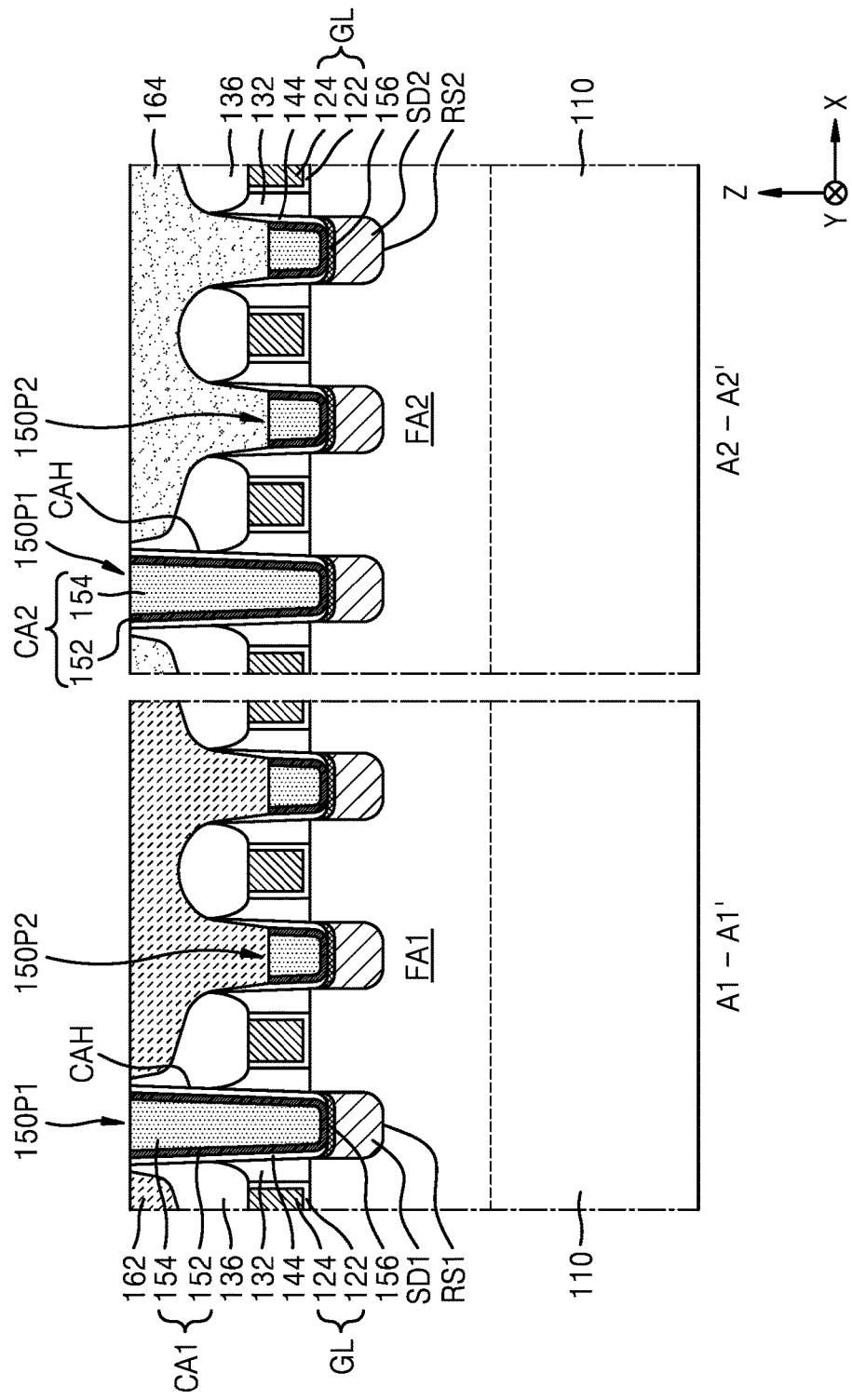
Figure 21B:
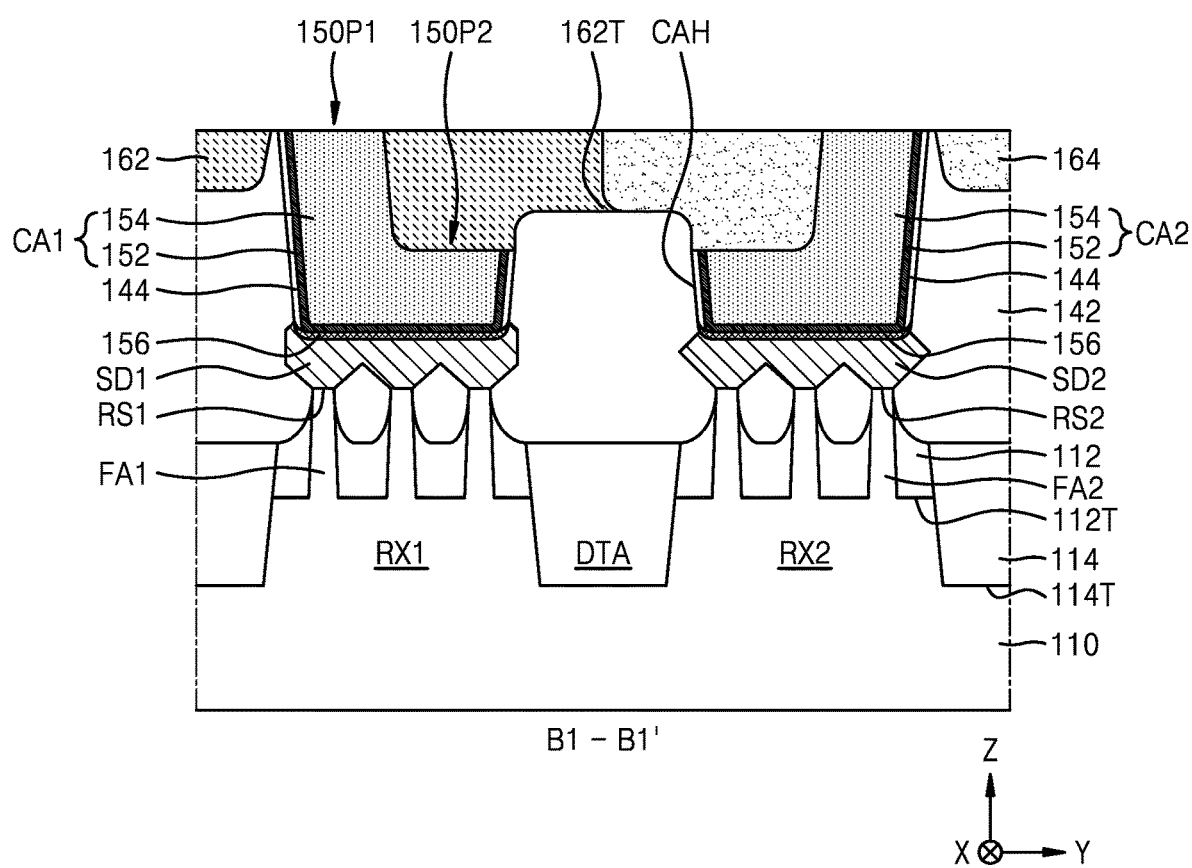

Referring to FIGS. 21A and 21B, the upper portions of the first stressor layer 162 and the second stressor layer 164 may be planarized such that the first portion 150P1 of the first source/drain contact CA1 and the first portion 150P1 of the second source/drain contact CA2 may be exposed. Accordingly, the first stressor layer 162 may surround the side wall of the first source/drain contact CA1 on the first active area RX1, and the second stressor layer 164 may surround the side wall of the second source/drain contact CA2 on the second active area RX2.

Figure 22A:
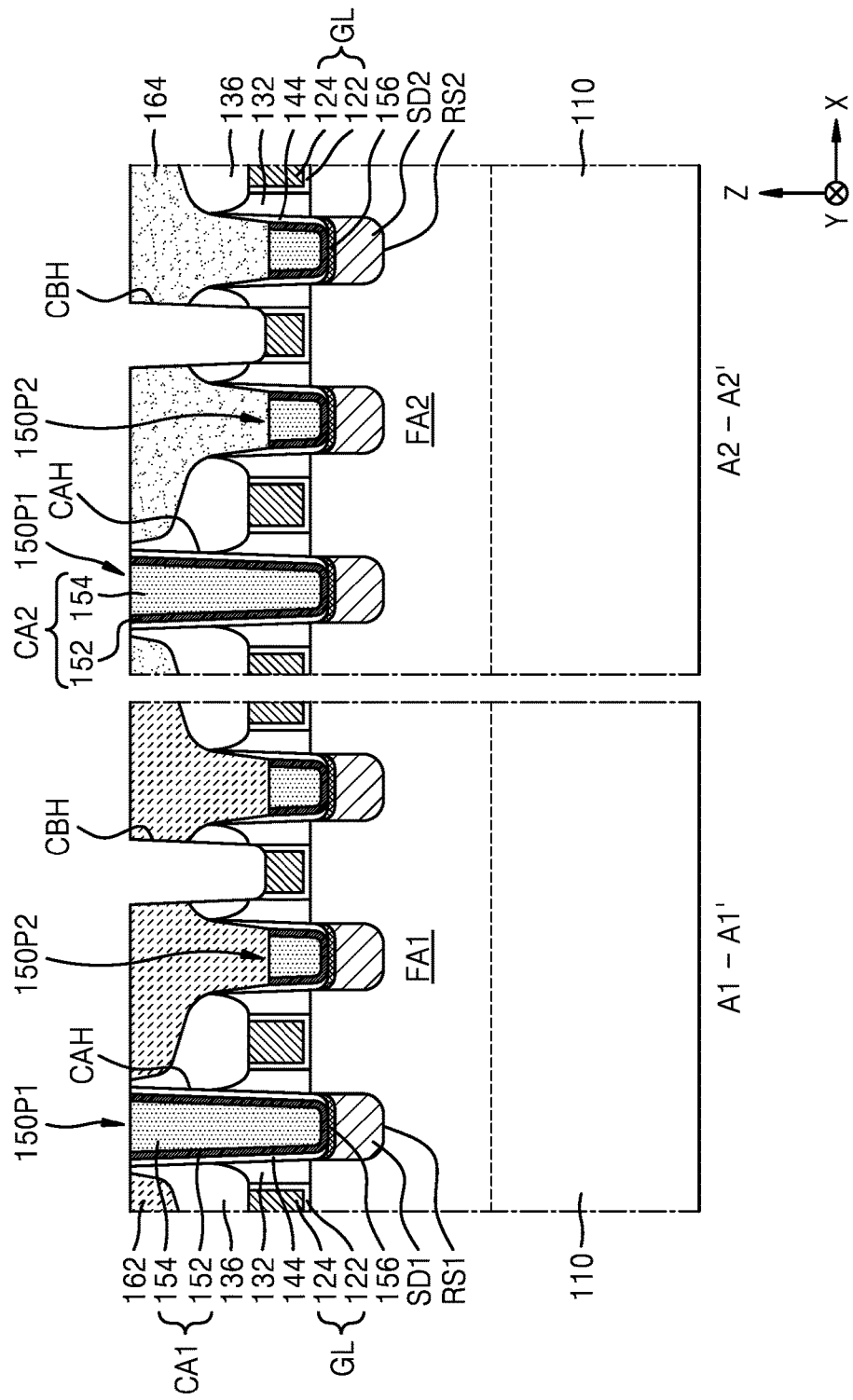
Figure 22B:
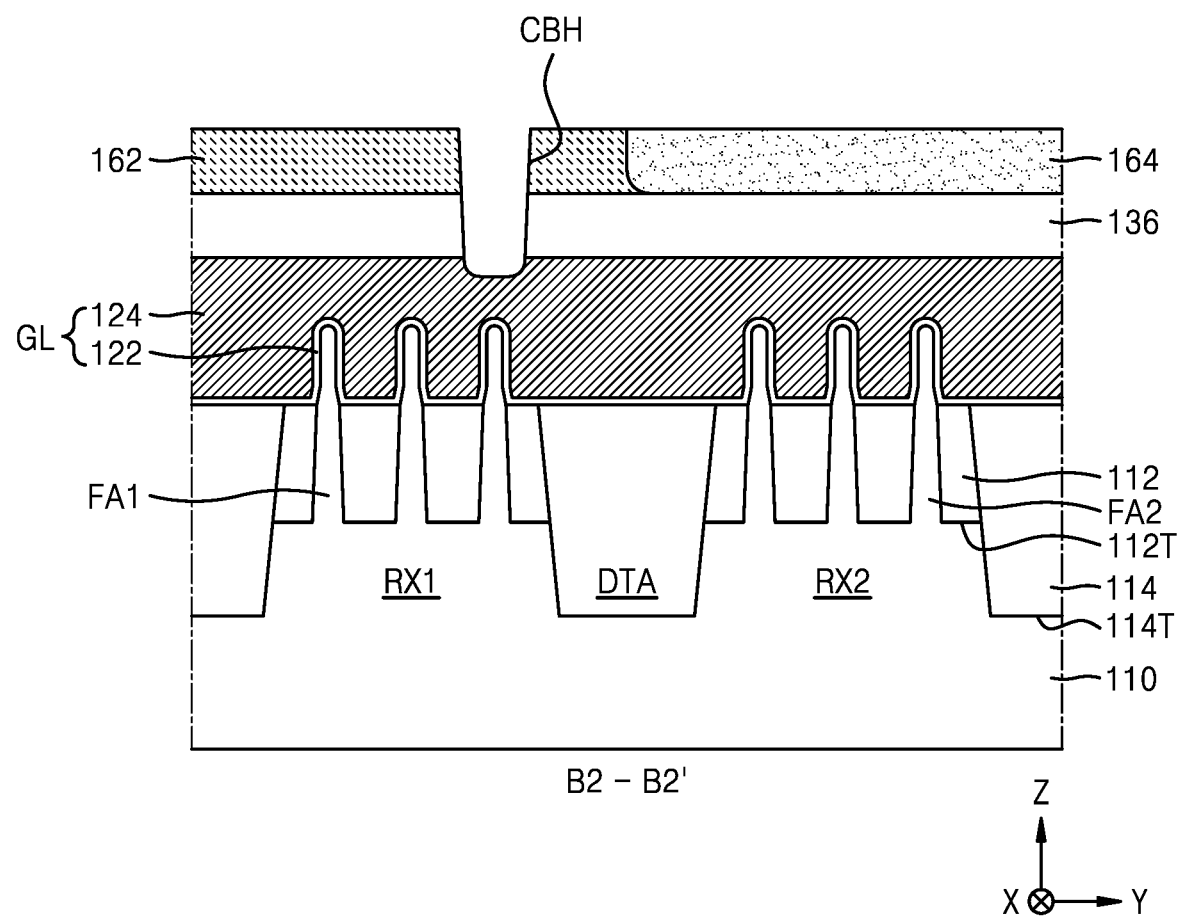

Referring to FIGS. 22A and 22B, gate contact holes CBH penetrating through the stressor layers 162, 164 and the gate capping layer 136 to expose the upper surfaces of the gate electrodes 124 may be formed.

In some embodiments, at least one gate contact hole CBH is disposed on the first active area RX1, and at least another gate contact hole CBH may be disposed on the second active area RX2. As described above with reference to FIG. 1, the gate contact hole CBH on the first active area RX1 may be disposed to have a relatively large separation distance D11 from the first portion 150P1 of the first source/drain contact CA1 and a relatively small separation distance D12 from the second portion 150P2 of the first source/drain contact CA1. In some embodiments, the gate contact hole CBH on the second active area RX2 may be similarly separated from the first portion 150P1 of the second source/drain contact CA2.

Figure 23A:
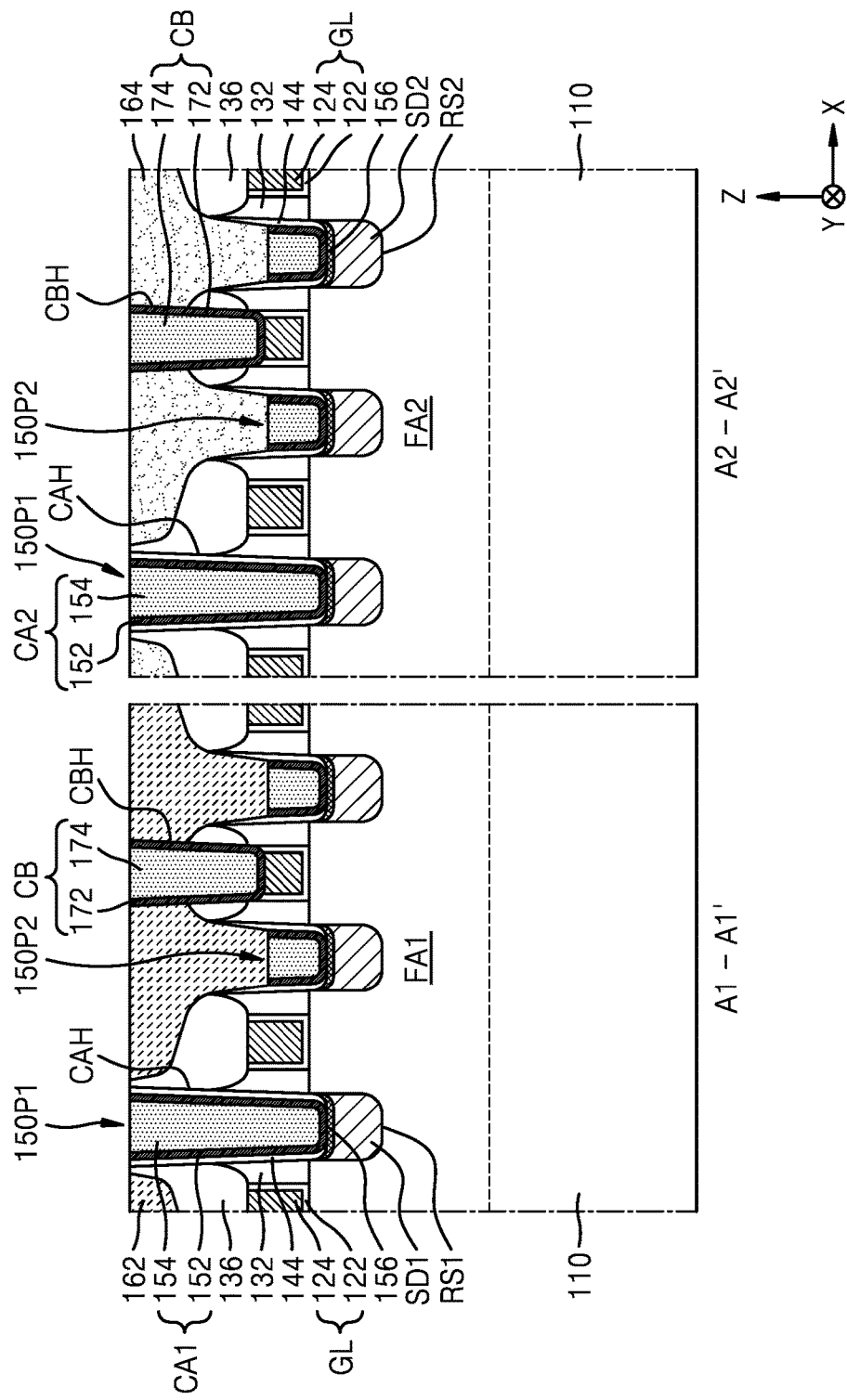
Figure 23B:
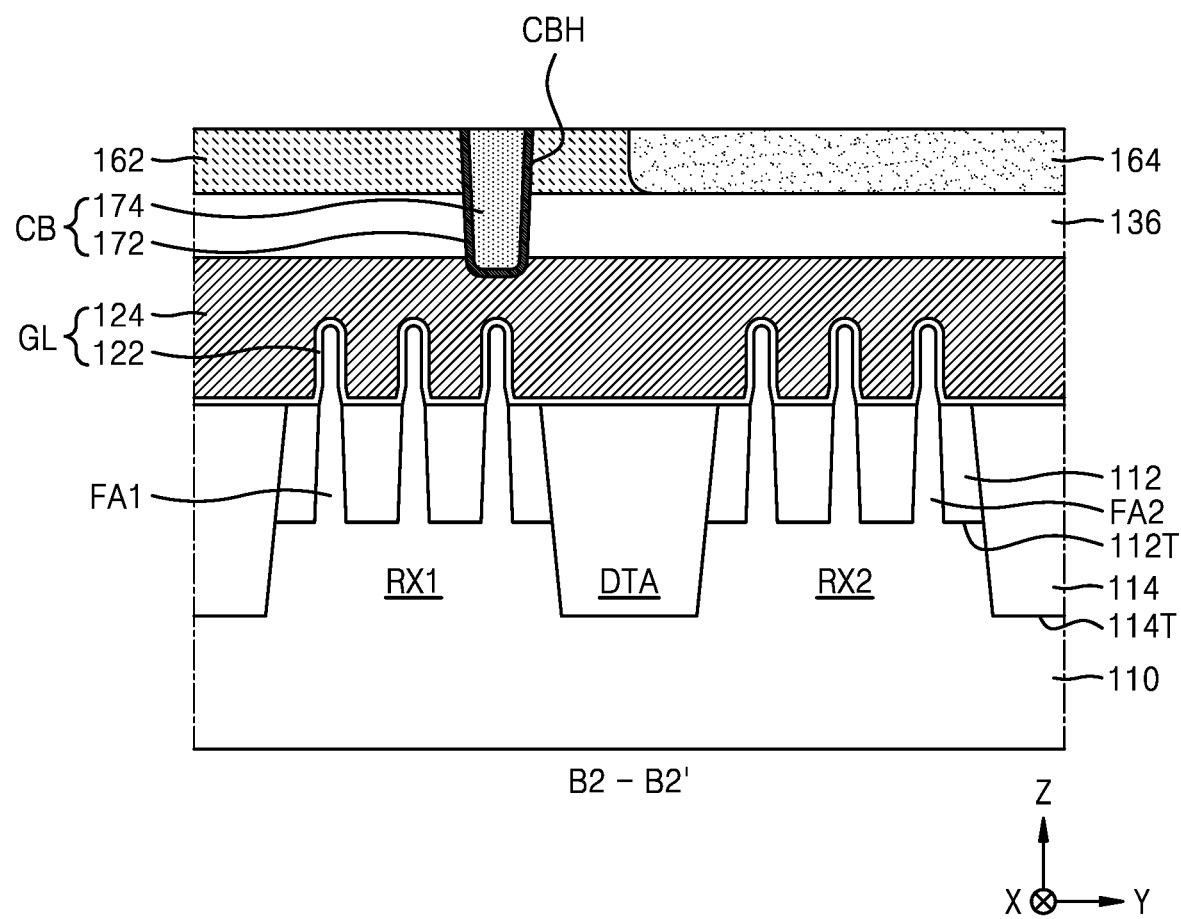

Referring to FIGS. 23A and 23B, the conductive barrier layer 172 may be formed on the internal wall of the gate contact hole CBH. A metal layer filling the inside of the gate contact hole CBH is formed on the conductive barrier layer 172, and the metal layer is planarized such that the first portion 150P1 of the first source/drain contact CA1 is exposed and the contact plug 174 may be formed in the gate contact hole CBH.

Referring back to FIGS. 1 to 4, the etch stop layer 180 is formed on the first stressor layer 162, the second stressor layer 164, the first and second source/drain contacts CA1 and CA2, and the gate contact CB, and the interlayer insulating layer 182 is formed on the etch stop layer 180.

After that, a via hole penetrating through the interlayer insulating layer 182 and the etch stop layer 180 is formed, and a metal material is filled in the via hole to form the conductive via 184. The wiring layer 186 may be formed on the conductive via 184.

The integrated circuit device 100 may be manufactured by the manufacturing method described above. According to the manufacturing method, because the recess process is performed on the first and second source/drain contacts CA1 and CA2, the first and second source/drain contacts CA1 and CA2 are formed to have the second portion 150P2 disposed at a lower level than the upper surface of the gate electrode 124 and the first portion 150P1 disposed at a higher level than the second portion 150P2 relative to the substrate 110. Accordingly, even when the gate contact hole CBH is formed in the first active area RX1, a sufficient separation distance between the gate contact hole CBH and the first portion 150P1 of the first source/drain contact CA1 may be ensured. Moreover, the first stressor layer 162 covering the upper surface of the second portion 150P2 of the first source/drain contact CA1 and the second stressor layer 164 covering the upper surface of the second portion 150P2 of the second source/drain contact CA2 respectively apply tensile stress and compressive stress to the NMOS transistor and the PMOS transistor, and thus, the electrical performance of the integrated circuit device 100 may be optimized.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a substrate comprising a first fin-type active area and a second fin-type active area;
   a gate structure extending in a first direction on the first fin-type active area and the second fin-type active area, the first direction being parallel to an upper surface of the substrate;
   a first source/drain region on a side of the gate structure on the first fin-type active area;
   a second source/drain region on a side of the gate structure on the second fin-type active area;
   a first source/drain contact on the first source/drain region, the first source/drain contact comprising a first portion and a second portion, the second portion of the first source/drain contact having an upper surface that is lower than an upper surface of the first portion of the first source/drain contact relative to the substrate;
   a second source/drain contact on the second source/drain region, the second source/drain contact comprising a first portion and a second portion, the second portion of the second source/drain contact having an upper surface that is lower than an upper surface of the first portion of the second source/drain contact relative to the substrate;
   a first stressor layer on the upper surface of the second portion of the first source/drain contact; and
   a second stressor layer on the upper surface of the second portion of the second source/drain contact, the second stressor layer comprising a second material that is different from a first material of the first stressor layer.

2. The integrated circuit device of claim 1, wherein the first stressor layer extends on side walls of the first portion of the first source/drain contact, and an upper surface of the first stressor layer is substantially coplanar with the upper surface of the first portion of the first source/drain contact, and
   wherein the second stressor layer extends on side walls of the first portion of the second source/drain contact, and an upper surface of the second stressor layer is substantially coplanar with the upper surface of the first portion of the second source/drain contact.

3. The integrated circuit device of claim 1, wherein, relative to the substrate, the upper surface of the second portion of the first source/drain contact is lower than an upper surface of the gate structure, and a bottom surface of the first stressor layer is lower than the upper surface of the gate structure.

4. The integrated circuit device of claim 1, wherein, relative to the substrate, the upper surface of the second portion of the second source/drain contact is lower than an upper surface of the gate structure, and a bottom surface of the second stressor layer is lower than the upper surface of the gate structure.

5. The integrated circuit device of claim 1, further comprising:
   a first gate contact on the gate structure on the first fin-type active area, wherein the first stressor layer extends on side walls of the first gate contact; and/or
   a second gate contact on the gate structure on the second fin-type active area, wherein the second stressor layer extends on side walls of the second gate contact.

6. The integrated circuit device of claim 5, wherein, along a direction parallel to the upper surface of the substrate, the first gate contact has a larger separation distance from the first portion of the first source/drain contact than from the second portion of the first source/drain contact, and/or the second gate contact has a larger separation distance from the first portion of the second source/drain contact than from the second portion of the second source/drain contact.

7. The integrated circuit device of claim 1, wherein an upper surface of the first stressor layer is substantially coplanar with an upper surface of the second stressor layer, and a side wall of the first stressor layer is in contact with a side wall of the second stressor layer.

8. The integrated circuit device of claim 1, further comprising:
   an inter-gate insulating layer on opposing side walls of the gate structure, and between the first source/drain region and the second source/drain region,
      wherein the substrate further comprises a deep trench area between the first and second fin-type active areas, and
      wherein a side wall of the first stressor layer and a side wall of the second stressor layer are in contact with each other on the inter-gate insulating layer on the deep trench area.

9. The integrated circuit device of claim 1, further comprising:
   a contact liner extending on side walls of the first source/drain contact,
      wherein a portion of the contact liner extending on the side walls of the second portion of the first source/drain contact is in contact with the first stressor layer.

10. The integrated circuit device of claim 1, further comprising:
    a gate capping layer on an upper surface of the gate structure and having a convex upper surface having the first stressor layer thereon;
    a conductive via on the first portion of the first source/drain contact; and
    a wiring layer on the conductive via.

11. The integrated circuit device of claim 1, wherein the first stressor layer comprises SiOC, SiON, SiCN, SiN, Tonen SilaZene (TOSZ), tetraethyl orthosilicate (TEOS), atomic layer deposition (ALD) oxide, flowable chemical vapor deposition (FCVD) oxide, high density plasma (HDP) oxide, and/or plasma enhanced oxidation (PEOX) oxide, and
    wherein the second stressor layer comprises SiOC, SiON, SiCN, SiN, TOSZ, TEOS, ALD oxide, FCVD oxide, HDP oxide, and/or PEOX oxide.

12. An integrated circuit device comprising:
    a substrate comprising a first fin-type active area and a second fin-type active area, the first fin-type active area and the second fin-type active area extending in a first direction;
    a gate structure extending in a second direction on the first fin-type active area and the second fin-type active area, the second direction being different from the first direction;
    a first source/drain region on a side of the gate structure on the first fin-type active area;
    a second source/drain region on a side of the gate structure on the second fin-type active area;
    a first source/drain contact on the first source/drain region, the first source/drain contact comprising a first portion and a second portion, the second portion of the first source/drain contact having an upper surface that is lower than an upper surface of the first portion of the first source/drain contact relative to the substrate;
    a second source/drain contact on the second source/drain region, the second source/drain contact comprising a first portion and a second portion, the second portion of the second source/drain contact having an upper surface that is lower than an upper surface of the first portion of the second source/drain contact relative to the substrate;
    a first stressor layer on the upper surface of the second portion of the first source/drain contact and having an upper surface that is substantially coplanar with the upper surface of the first portion of the first source/drain contact; and
    a second stressor layer on the upper surface of the second portion of the second source/drain contact and having an upper surface that is substantially coplanar with the upper surface of the first portion of the second source/drain contact, the second stressor layer comprising a second material that is different from a first material of the first stressor layer.

13. The integrated circuit device of claim 12, wherein the first stressor layer extends on side walls of the first portion of the first source/drain contact, and wherein the second stressor layer extends on side walls of the first portion of the second source/drain contact.

14. The integrated circuit device of claim 12, wherein, relative to the substrate, the upper surface of the second portion of the first source/drain contact is lower than an upper surface of the gate structure, and a bottom surface of the first stressor layer is lower than the upper surface of the gate structure, and
    wherein, relative to the substrate, the upper surface of the second portion of the second source/drain contact is lower than the upper surface of the gate structure, and a bottom surface of the second stressor layer is lower than the upper surface of the gate structure.

15. The integrated circuit device of claim 12, wherein the upper surface of the first stressor layer is substantially coplanar with the upper surface of the second stressor layer, and
    wherein a side wall of the first stressor layer is in contact with a side wall of the second stressor layer.

16. The integrated circuit device of claim 12, further comprising:
    a gate capping layer on an upper surface of the gate structure;
    a first gate contact on the gate structure, the first gate contact extending in a first gate contact hole that penetrates through the first stressor layer and the gate capping layer; and
    a second gate contact on the gate structure, the second gate contact extending in a second gate contact hole that penetrates through the second stressor layer and the gate capping layer.

17. An integrated circuit device comprising:
a first fin-type active area and a second fin-type active area protruding from a substrate and extending in a first direction;
a plurality of first semiconductor patterns spaced apart from an upper surface of the first fin-type active area, the plurality of first semiconductor patterns each including a respective first channel region;
a plurality of second semiconductor patterns spaced apart from an upper surface of the second fin-type active area, the plurality of second semiconductor patterns each including a respective second channel region;
a gate structure extending on the first fin-type active area and the second fin-type active area in a second direction that is perpendicular to the first direction, the gate structure extending on the plurality of first semiconductor patterns and the plurality of second semiconductor patterns;
a first source/drain region on a side of the gate structure and contacting the plurality of first semiconductor patterns;
a second source/drain region on a side of the gate structure and contacting the plurality of second semiconductor patterns;
a first source/drain contact on the first source/drain region, the first source/drain contact comprising a first portion and a second portion, the second portion of the first source/drain contact having an upper surface that is lower than an upper surface of the first portion of the first source/drain contact relative to the substrate;
a second source/drain contact on the second source/drain region, the second source/drain contact comprising a first portion and a second portion, the second portion of the second source/drain contact having an upper surface that is lower than an upper surface of the first portion of the second source/drain contact relative to the substrate;
a first stressor layer on the upper surface of the second portion of the first source/drain contact; and
a second stressor layer on the upper surface of the second portion of the second source/drain contact, the second stressor layer comprising a second material different from a first material of the first stressor layer.

18. The integrated circuit device of claim 17, wherein the first stressor layer extends on side walls of the first portion of the first source/drain contact, and the second stressor layer extends on side walls of the first portion of the second source/drain contact.

19. The integrated circuit device of claim 17, wherein, relative to the substrate, the upper surface of the second portion of the first source/drain contact is lower than an upper surface of the gate structure, and the upper surface of the second portion of the second source/drain contact is lower than the upper surface of the gate structure, and
wherein an upper surface of the first stressor layer is substantially coplanar with an upper surface of the second stressor layer, and a side wall of the first stressor layer is in contact with a side wall of the second stressor layer.

20. The integrated circuit device of claim 17, further comprising:
a gate capping layer on an upper surface of the gate structure;
a first gate contact on the gate structure, the first gate contact extending in a first gate contact hole that penetrates through the first stressor layer and the gate capping layer; and
a second gate contact on the gate structure, the second gate contact extending in a second gate contact hole that penetrates through the second stressor layer and the gate capping layer.

* * * * *